US008384507B2

(12) United States Patent
Li et al.

(10) Patent No.: US 8,384,507 B2
(45) Date of Patent: Feb. 26, 2013

(54) THROUGH VIA INDUCTOR OR TRANSFORMER IN A HIGH-RESISTANCE SUBSTRATE WITH PROGRAMMABILITY

(75) Inventors: Xia Li, San Diego, CA (US); Jonghae Kim, San Diego, CA (US); Chi Shun Lo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 81 days.

(21) Appl. No.: 12/791,023

(22) Filed: Jun. 1, 2010

(65) Prior Publication Data

US 2011/0291786 A1 Dec. 1, 2011

(51) Int. Cl.
*H01F 5/00* (2006.01)
(52) U.S. Cl. ............... 336/200; 336/223; 336/232
(58) Field of Classification Search .......... 336/200, 336/223, 232
See application file for complete search history.

(56) References Cited

U.S. PATENT DOCUMENTS

| | | | |
|---|---|---|---|
| 6,437,653 B1 | 8/2002 | Cruz et al. | |
| 7,015,571 B2 * | 3/2006 | Chang et al. | 257/686 |
| 2003/0061591 A1 | 3/2003 | Li et al. | |
| 2004/0150968 A1 * | 8/2004 | Ravid et al. | 361/777 |
| 2005/0068146 A1 | 3/2005 | Jessie | |
| 2006/0132276 A1 | 6/2006 | Harding | |
| 2007/0164843 A1 * | 7/2007 | Yagisawa et al. | 336/83 |
| 2008/0128883 A1 * | 6/2008 | Lee | 257/686 |
| 2009/0045904 A1 | 2/2009 | Chen et al. | |
| 2009/0315156 A1 * | 12/2009 | Harper | 257/660 |
| 2010/0117215 A1 * | 5/2010 | Lee | 257/691 |

FOREIGN PATENT DOCUMENTS

JP 7272932 10/1995

OTHER PUBLICATIONS

International Search Report and Written Opinion—PCT/US2011/038604, ISA/EPO—Oct. 11, 2011.

* cited by examiner

*Primary Examiner* — Mohamad Musleh
*Assistant Examiner* — Ronald Hinson
(74) *Attorney, Agent, or Firm* — Michelle Gallardo; Nicholas J. Pauley; Jonathan T. Velasco

(57) ABSTRACT

A through via inductor or transformer in a high-resistance substrate in an electronic package. In one embodiment, the package comprises a target inductor which includes a through-via formed in the substrate through which a signal passes and a tuner inductor which includes a through-via formed in the substrate such that the through-via has an independent signal passing therethrough. The direction of the signal passing through the tuner inductor can be independently controlled to adjust the total inductance of the target inductor. In another embodiment, a transformer can comprise a primary loop and a secondary loop, each of which includes a plurality of through-vias that are coupled to a plurality of conductive traces. The primary loop forms a first continuous conductive path and the secondary loop forms a second continuous conductive path. A signal passing through the primary loop can induce a signal in the secondary loop such that the induced signal is dependent on the transformer ratio.

31 Claims, 17 Drawing Sheets

THROUGH VIA INDUCTOR OR TRANSFORMER IN A HIGH-RESISTANCE SUBSTRATE WITH PROGRAMMABILITY

FIELD OF DISCLOSURE

This disclosure relates generally to an electronic package, and in particular to a programmable through via inductor or transformer formed in a high-resistance substrate of an electronic package.

BACKGROUND

In electronic packaging, two-dimensional inductors and transformers can be integrated in a top metal layer of the back-end-of-the-line (BEOL) of the package. The inductor or transformer occupies a large area (e.g., 300×300 $\mu m^2$) in the metal layer, and the inductor has a small inductance value and the transformer has a low efficiency. In addition, the inductor or transformer can have a significant impact on mutual inductance on the package. This impact is due to current passing through the inductor or transformer in a direction parallel to the top and bottom surfaces of the substrate. Thus, the area beneath the inductor or transformer is unoccupied and cannot be used for an active device such as a transistor.

The inductor or transformer also has values that cannot be changed or varied. In other words, the inductance value of the two-dimensional inductor is set during fabrication and cannot be programmed or changed after implementation. Similarly, the two-dimensional transformer cannot be programmed after implementation. Therefore, the package has limited performance and efficiency.

Another drawback to this type of electronic package is when the substrate is made of silicon. The silicon substrate can have losses therein due to eddy currents. In addition, the resonant frequency is low in the silicon substrate.

Because of the disadvantages of the prior art, it would be desirable to provide an electronic package that includes an inductor or transformer that occupies less space and can be programmed to different values based on need after implementation. In addition, it would be desirable for the inductor or transformer to be three-dimensional in which the current passes substantially vertically therethrough to limit the impact of mutual inductance on the rest of the package. The package can also overcome other drawbacks found in the prior art when the substrate is formed of a high-resistance material.

SUMMARY

For a more complete understanding of the present disclosure, reference is now made to the following detailed description and the accompanying drawings.

In one exemplary embodiment, a circuit is provided in an electronic package. The circuit includes a high-resistance substrate having a top surface and a bottom surface. The circuit also includes a target inductor and a tuner inductor. The target inductor comprises a through-via formed in the substrate through which a signal passes. In addition, the tuner inductor comprises a through-via formed in the substrate. An independent signal passes through the through-via of the tuner inductor in a first or second direction. The direction of the signal passing through the tuner inductor is independently controlled such that the total inductance of the target inductor can be varied by changing the direction of the signal passing through the through-via of the tuner inductor.

In another embodiment, an inductor is formed in a high-resistance substrate. The inductor includes a plurality of through-vias in the high-resistance substrate. In addition, a plurality of conductive traces are formed on the top surface of the substrate. Each conductive trace couples one of the through-vias to another of the through-vias. Also, a plurality of conductive traces are formed on the bottom surface of the substrate such that each conductive trace couples one of the through-vias to another of the through-vias. The plurality of conductive traces on the top and bottom surfaces and the plurality of through-vias form a continuous conductive path. Further, as a signal passes through the conductive path, the mutual inductance impact of the plurality of through-vias is negligible.

In a different embodiment, a transformer is provided in a high-resistance substrate. The transformer comprises a primary loop that has a plurality of through-vias disposed in the substrate. The plurality of through-vias are coupled to conductive traces at the top and bottom surfaces of the substrate to form a first continuous conductive path. Also, a secondary loop includes a plurality of through-vias disposed in the substrate. The plurality of through-vias are coupled to different conductive traces at the top and bottom surfaces of the substrate to form a second continuous conductive path. The second continuous conductive path is independent of the first continuous conductive path. As such, a signal passing through the primary loop induces a signal in the secondary loop, the signal in the secondary loop being dependent on the quantity of through-vias in the primary and secondary loops.

In this embodiment, as the signal passes through one of the plurality of through-vias of the primary or secondary loop, the direction of the signal is orthogonal to the top and bottom surfaces of the substrate. Further, when the number of through-vias of the primary loop exceeds the number of through-vias of the secondary loop, the induced signal decreases. On the other hand, when the number of through-vias of the secondary loop exceeds the number of through-vias of the primary loop, the induced signal increases.

In another exemplary embodiment, an integrated circuit is provided in an electronic package. The circuit includes a high-resistance substrate, a means for storing energy in a magnetic field, and a means for tuning the means for storing. In the circuit, an independent signal passes through the means for tuning in a first direction or a second direction. The first direction is parallel but opposite the second direction. Also, the direction of the signal passing through the means for tuning is independently controlled such that the total inductance of the means for storing can be varied by changing the direction of the signal.

In a different exemplary embodiment, a method of tuning a target inductor in a high resistance substrate is provided. The method includes forming a target inductor and tuner inductor in the substrate such that the target inductor and tuner inductor each include a through-via. The method further includes passing a signal through the through-via of the tuner inductor in a first direction or a second direction, the second direction being parallel but opposite the first direction. The direction of the signal is controlled such that the total inductance of the target inductor can be varied by changing the direction of the signal passing through the through-via of the tuner inductor.

In this embodiment, the method includes increasing the total inductance of the target inductor by passing the signal through at least one of the plurality of tuner inductors in the same direction as the signal passes through the target inductor. On the other hand, the method includes decreasing the total inductance of the target inductor by passing the signal through at least one of the plurality of tuner inductors in the opposite direction as the signal passes through the target inductor.

In an exemplary embodiment, a method of forming a transformer in a high resistance substrate is provided. The method comprises fabricating a primary loop in the substrate. The primary loop has a plurality of through-vias coupled to conductive traces at the top and bottom surfaces of the substrate to form a first continuous conductive path. Additionally, the method includes fabricating a secondary loop in the substrate. The secondary loop has a plurality of through-vias coupled to different conductive traces at the top and bottom surfaces of the substrate to form a second continuous conductive path, the second continuous conductive path being independent of the first continuous conductive path. The method also includes passing a first signal through the primary loop and inducing a second signal in the secondary loop. The second signal is dependent on the quantity of through-vias in the primary and secondary loops.

In another exemplary embodiment, a method of forming a target inductor in an integrated circuit is provided. The method includes forming a primary loop and a secondary loop in a high-resistance substrate. The primary loop has a plurality of through-vias coupled to conductive traces at the top and bottom surfaces of the substrate to form a first continuous conductive path and the secondary loop has a plurality of through-vias coupled to different conductive traces at the top and bottom surfaces of the substrate to form a second continuous conductive path. The second continuous conductive path is independent of the first continuous conductive path. The method further includes a step for inducing a signal in the secondary loop such that the induced signal is dependent on the quantity of through-vias in the primary and secondary loops.

Advantageously, the through-via inductor and through-via transformer can be integrated into an electronic package. Less space is occupied in the substrate by the through-via inductor and transformer. Also, in the through-via inductor embodiments, the total inductance can be adjusted or programmed by changing the direction of signals passing through tuner inductors, for example. Since both the through-via inductor and transformer are three-dimensional, signals pass substantially vertically through the through-vias and therefore mutual inductance does not interfere with active devices disposed above or beneath the inductor or transformer. In addition, the high-resistance substrate can have less losses and a higher resonant frequency than a silicon substrate. Thus, the present invention overcomes the shortcomings of the prior art and provides programmability to the electronic package.

DETAILED DESCRIPTION

Figure 1:
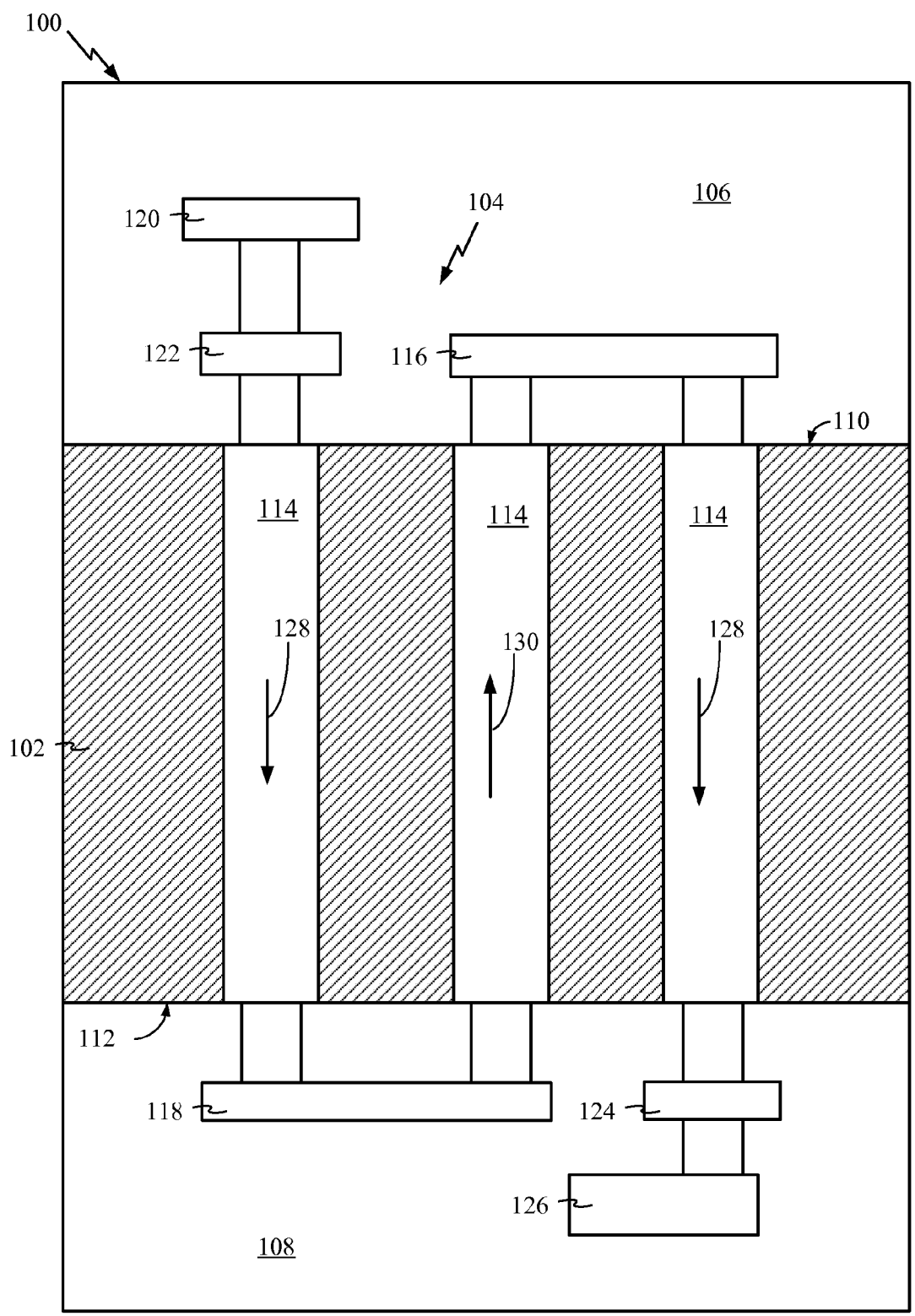
FIG. 1 is a cross-sectional view of an electronic package including a three-dimensional inductor.

Referring to the exemplary embodiment shown in FIG. 1, an electronic package 100 is provided with a high-resistance substrate 102 such as glass or sapphire. For purposes of the following discussion, the substrate 102 will be described as being formed of glass, but in other embodiments sapphire or another high-resistance material can be used. A three-dimensional inductor 104 is formed in the package 100 and includes a plurality of through-vias 114.

Each of the plurality of through-vias 114 is coupled to a frontside conductive trace 116 on the frontside of the substrate 102 and a backside conductive trace 118 on the backside of the substrate 102. The frontside conductive trace 116 and other metal layers 120, 122 are surrounded by a frontside dielectric material 106 such as silicon dioxide. Likewise, the backside conductive trace 118 and backside metal layers 124, 126 are surrounded by a backside dielectric material 108. The frontside and backside conductive traces 116, 118 are formed of conductive material such as copper, for example. In the embodiment of FIG. 1, the plurality of through-vias 114, the frontside conductive trace 116, and backside conductive trace 118 form a continuous conductive path. Although not shown in FIG. 1, there can be a plurality of frontside and backside conductive traces 116, 118 that couple to the plurality of through-vias 114.

Figure 2:
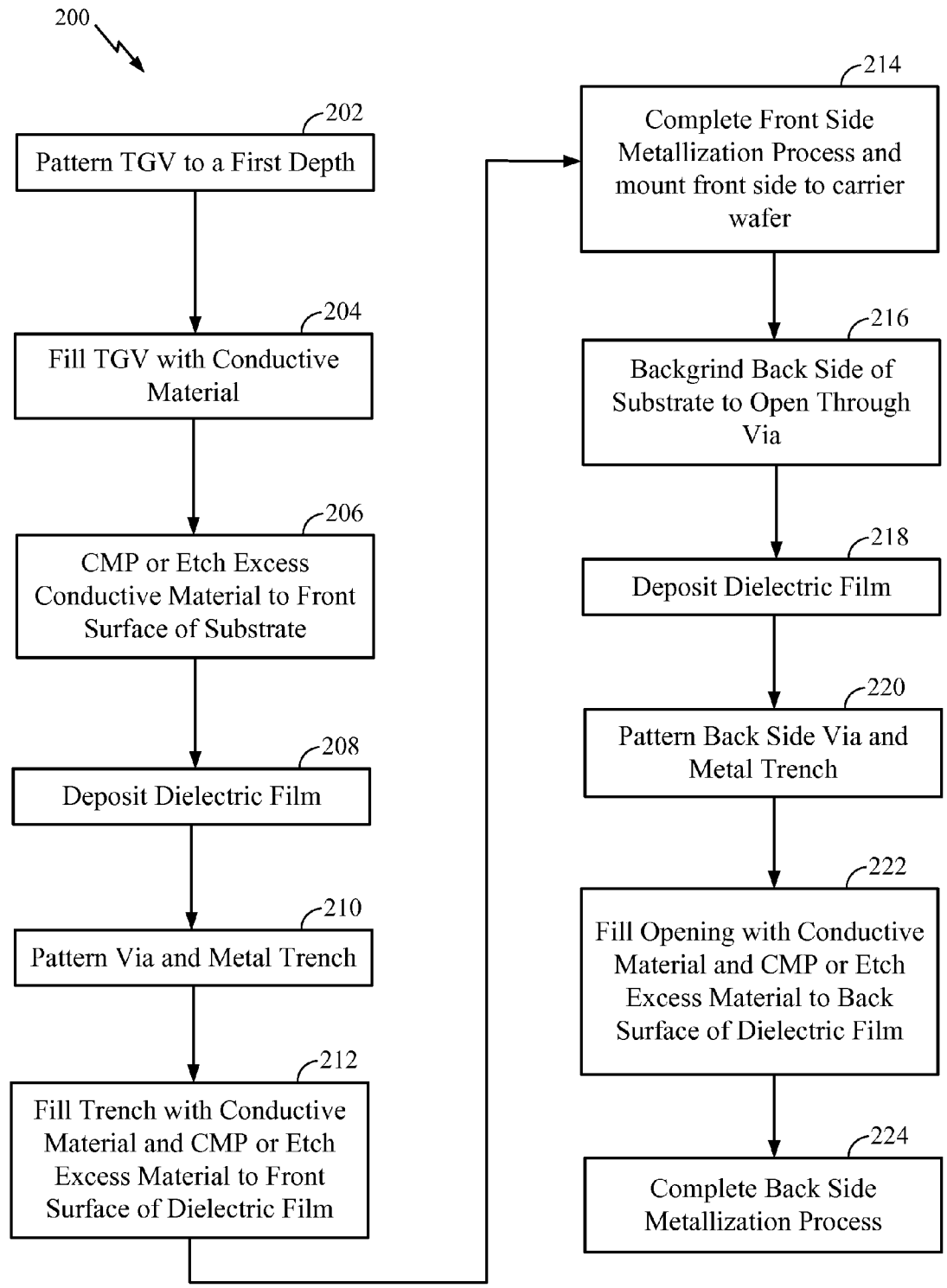
FIG. 2 is a flow diagram of a method of forming a through via in a glass substrate.

The plurality of through-vias 114 is formed of conductive material such as copper and can be fabricated in the substrate 102 according to a method 200 of FIG. 2. In block 202 of FIG. 2, a via is patterned in a glass substrate to a first depth. This depth is less than the total thickness of the substrate before grinding. Once the via is patterned, conductive material such as copper is deposited in the via in block 204. In block 206, an excess amount of conductive material can then be etched or removed by a chemical mechanical polishing (CMP) process from the front surface of the substrate.

In block 208, a dielectric film can be deposited along the surface of the substrate. The dielectric film can be silicon dioxide ($SiO_2$), silicon oxynitride (SiON), silicon nitride (SiN), or other known dielectric material. Once the dielectric film is deposited, a via or metal trench can be patterned through the dielectric film in block 210. To do so, the trench can be etched in the dielectric material using a photoresist pattern. In block 212, the trench is then filled with conductive material. Since an excess amount of conductive material can overlay portions of the dielectric film, the excess amount is etched away or removed by a CMP process. In block 214, the frontside metallization process is completed and the front surface of the substrate is mounted to a carrier wafer.

Once the frontside of the substrate is completed, the backside of the glass substrate is grinded in block 216 to open the partial-via of block 202 and make it a through-via to the backside of the substrate. Once the via is opened on the backside, a dielectric film is deposited thereon in block 218. The dielectric material can include silicon dioxide (SiO$_2$), silicon oxynitride (SiON), silicon nitride (SiN), or other known dielectric material. Again, since the dielectric material can partially or completely block the through-via when deposited on the backside of the substrate, the via and metal trench is patterned in block 220 to form an opening in the dielectric film. In block 222, conductive material is deposited in the trench and any excess conductive material is etched or removed by a CMP process. The backside metal layers are formed and any remaining metallization processes are completed on the backside of the glass substrate in block 224.

There are several ways a through-glass via can be formed and the method 200 described above is only one example. For instance, alumina metal can be deposited to fill the via. The alumina metal process can be desirable due to lower costs. Other known processes are also possible for fabricating a through-via in a high-resistance substrate.

Returning to the embodiment of FIG. 1, the length of each through-via 114 can be the same or greater than the thickness of the substrate 102. In one non-limiting example, the diameter and length of a through-via 114 can be between 5-50 μm and 50-700 μm, respectively. Since length impacts the total amount of inductance, the inductor 104 has a greater inductance range when the through-via is longer. In other words, by increasing the thickness of the substrate 102, the inductance range of the inductor 104 is also increased. Inductance can also be increased by adding one or more through-vias 114.

The total inductance range of the inductor 104 comprises both self inductance and mutual inductance. In the embodiment of FIG. 1, a signal can pass through the plurality of through-vias 114 in a first direction 128 or a second direction 130. The first and second directions 128, 130 are substantially orthogonal to the top surface 110 and bottom surface 112 of the substrate 102. In addition, the first direction 128 and second direction 130 are substantially parallel but in opposite directions from one another. Thus, the mutual inductance between adjacent through-vias can cancel each other and the net mutual inductance is reduced. In other words, the mutual inductance cancels out due to the signal passing in parallel but opposite directions through adjacent through-vias. As such, the total inductance range of the inductor 104 depends on the self inductance and net mutual inductance of each of the plurality of through-vias 114. In another non-limiting example, if the inductor 104 included 400 through-vias and each through-via had a self inductance of 0.115 nH, the total inductance of the inductor would be about 46 nH.

Figure 3:
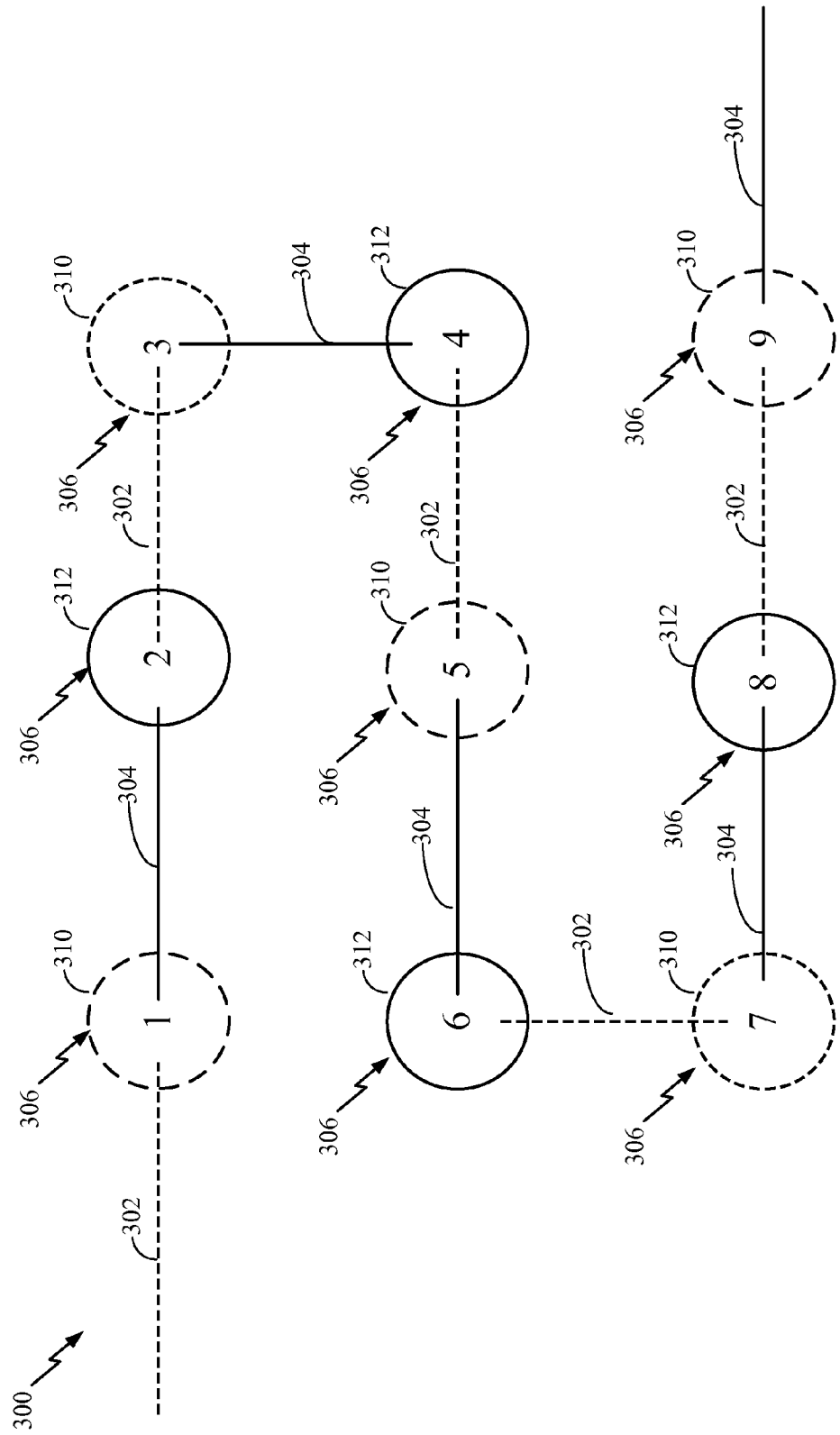
FIG. 3 is a schematic of a three-dimensional inductor in a high-resistance substrate.

The plurality of through-vias 114 that form the inductor can be arranged in an array. For instance, in the embodiment of FIG. 3, an inductor 300 includes a plurality of through-vias 306 formed in a high-resistance substrate. The plurality of through-vias 306 is arranged in a 3×3 matrix. In the upper left-hand corner of the array, the first through-via (labeled #1) is coupled with a backside conductive trace 302 at one end thereof and a frontside conductive trace 304 at the opposite end. As a signal passes through the first through-via 306, the signal travels in a first direction 310 from the backside to the frontside of the substrate. For illustrative purposes, a signal passing in the first direction 310 is illustrated by the through-via 306 being shown in dashed lines. On the other hand, a signal passing in the opposite direction, e.g., second direction 312, is illustrated by the corresponding through-via 306 being shown as a solid line.

Since the first through-via 306 is coupled to the second through-via 306 (labeled #2) by the frontside conductive trace 304, a continuous conductive path is formed between the first and second through-vias. Likewise, the third through the ninth through-vias 306 (labeled #3-#9) are coupled to one another by a plurality of backside conductive traces 302 and frontside conductive traces 304 to form a single, continuous conductive path. The path winds between the frontside and backside of the substrate, thereby forming a three-dimensional inductor.

Although not shown, the length of each conductive trace is substantially smaller than the length of each through-via 306. The length of each conductive trace therefore does not significantly impact the inductance of the inductor 300. Similar to the inductor 104 described above, as the signal passes through the inductor 300, it passes through adjacent through-vias 306 in parallel but opposite directions. The mutual inductance of the inductor 300 is offset and therefore has little impact on other active devices that can be disposed above or below the inductor 300. In other words, one of the disadvantages of the two-dimensional inductor is that active devices such as transistors cannot be stacked above or beneath the inductor. Since current passing through the two-dimensional inductor is parallel to the top and bottom surfaces of the substrate, the mutual inductance generated from the inductor negatively impacts other devices disposed above or below the inductor. Therefore, the two-dimensional inductor must be disposed in the top metal layers of the BEOL and the layers and substrate below the inductor are unoccupied and unused.

However, in the above-described embodiments of the three-dimensional inductor, signals passing through the inductor are substantially orthogonal to the top and bottom surfaces of the inductor. Since the signal passes through adjacent through-vias in opposite directions, the mutual inductance has no substantial impact on other nearby devices. Thus, one of several advantages of the three-dimensional inductor is the ability to stack one or more dies above or below the inductor. Active devices and interconnect wires therefore can also be disposed above or below the three-dimensional inductor without being impacted by mutual inductance.

Figure 4:
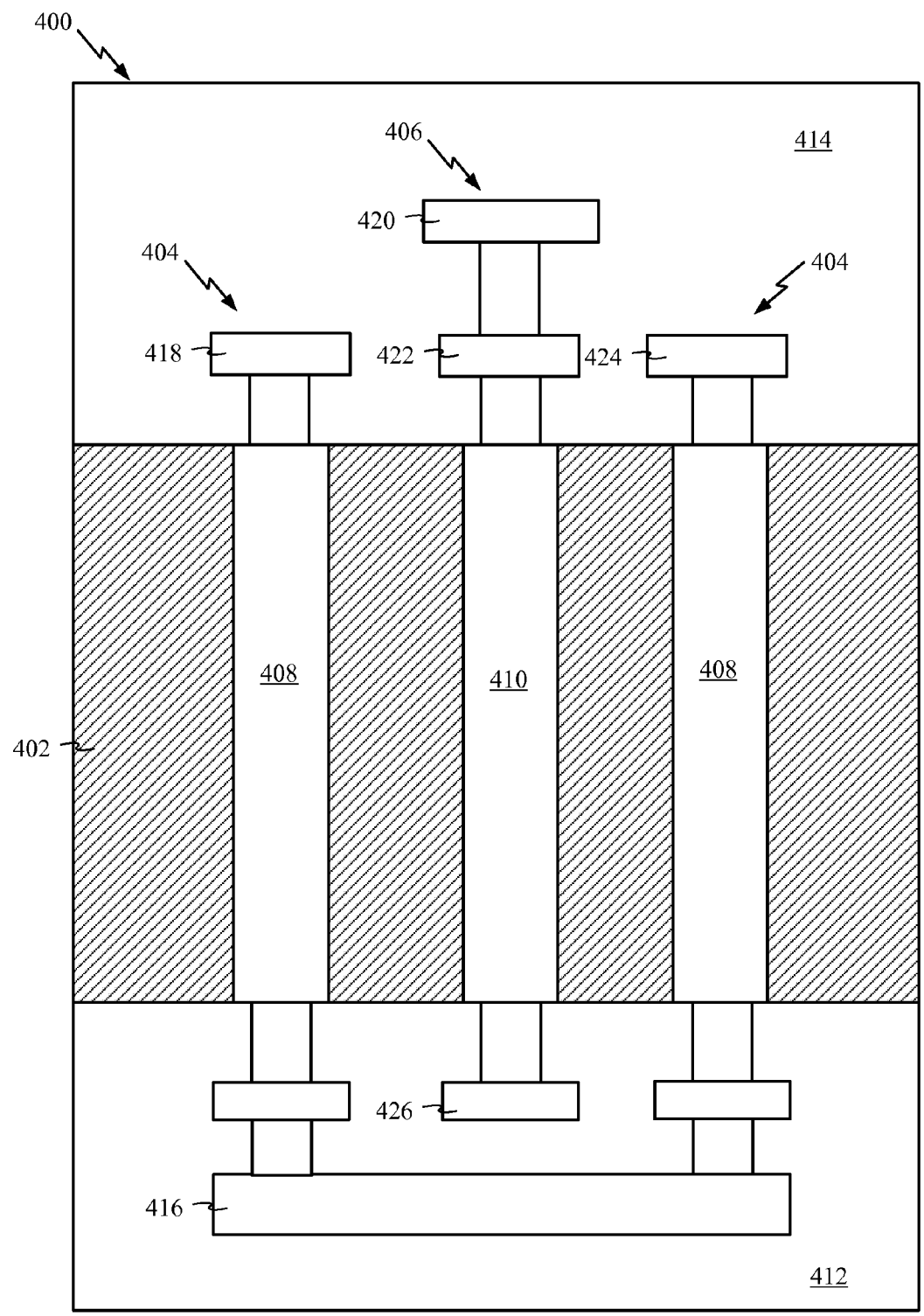
FIG. 4 is a cross-sectional view of an electronic package including a three-dimensional inductor and a tuner inductor.

With reference to FIG. 4, a different embodiment of a three-dimensional inductor is provided in an electronic package 400. The package 400 includes a high-resistance substrate 402 made of glass, sapphire, or other high-resistance material. A target inductor 404 is formed in the substrate 402 and includes a through-via 408. The through-via 408 is formed of a conductive material such as copper and extends the length of the thickness of the substrate 402. The target inductor 404 can include a plurality of through-vias 408. The package 400 also includes a tuner inductor 406 formed in the substrate 402. The tuner inductor 406 includes a through-via 410 formed in the substrate 402, but in other embodiments, the tuner inductor 406 can include a plurality of through-vias 410. In addition, the package 400 can include a plurality of target inductors 404 and tuner inductors 406.

The target inductor 404 can be coupled to a metal layer and/or conductive trace at the frontside and backside of the substrate 402. For instance, in FIG. 4, the through-vias 408 of the target inductor 404 are coupled to a backside trace 416 and a pair of metal layers 418, 424 on the frontside of the substrate 402. The metal layers 418, 424 on the frontside of the substrate 402 are surrounded by a dielectric material 414. Likewise, the backside trace 416 is surrounded by a dielectric material 412 on the backside of the substrate 402. In the event more than one target inductor 404 is fabricated in the package 400, each of the target inductors 404 are coupled together to form a continuous conductive path.

The tuner inductor 406 can be coupled to conductive traces and metal layers at both the frontside and backside of the substrate as well. In FIG. 4, for example, the through-via 410 is coupled to two metal layers 420, 422 on the frontside and a metal layer 426 on the backside. The through-via 410 may also couple to a conductive trace on the frontside and backside of the substrate 402. However, each tuner inductor 406 forms its own independent conductive path. In other words, when more than one tuner inductor 406 is fabricated in the package 400, each tuner inductor 406 is separate from the other tuner inductors 406. In this manner, each tuner inductor 406 can be controlled independently of the other tuner inductors 406.

The tuner inductors 406 can be arranged as an array in the package 400. Signals can be passed through each through-via 410 of each tuner inductor 406 to control the inductance of the target inductor 404. To do so, the direction of a signal passing through one tuner inductor 406 can be changed to adjust the total inductance of the target inductor 404. This is described with the forthcoming examples.

Figure 5:
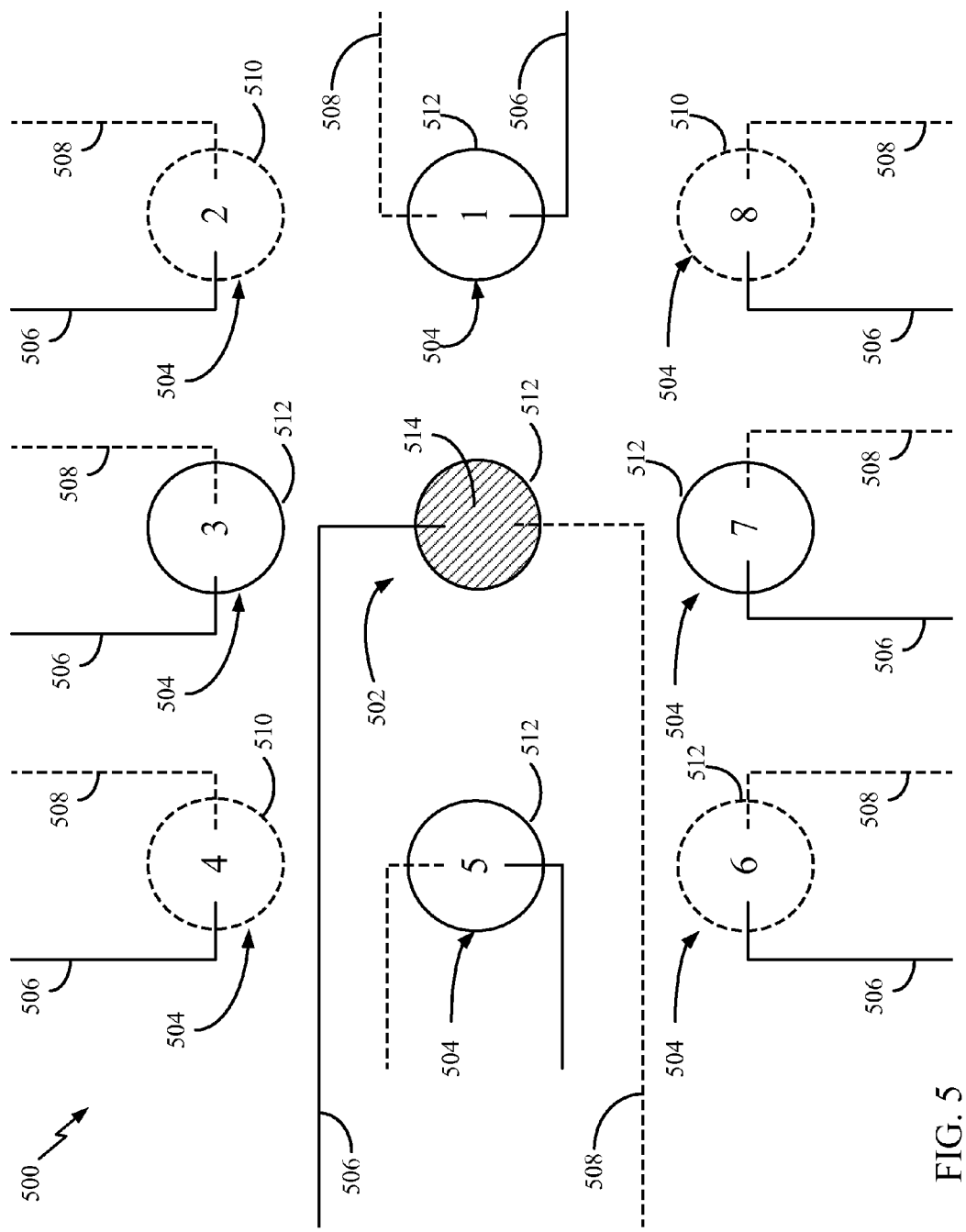
FIG. 5 is a schematic of a first exemplary programmable three-dimensional inductor in a high-resistance substrate.

With reference to FIG. 5, an exemplary embodiment of an electronic package 500 is provided. The electronic package 500 includes a high-resistance substrate, a target inductor 502, and a plurality of tuner inductors 504. The target inductor 502 includes a through-via 514 that is coupled to a frontside conductive trace 506 and a backside conductive trace 508. Likewise, each of the plurality of tuner inductors 504 includes a through-via that is coupled to a different frontside conductive trace 506 and backside conductive trace 508.

A signal can pass through each of the through-vias 514 of the target inductor 502 and the plurality of tuner inductors 504 in a first direction 510 or a second direction 512. The first direction 510 and second direction 512 are opposite one another (e.g., from the frontside to the backside or the backside to the frontside of the substrate) and substantially orthogonal to the front and back surfaces of the substrate. For illustrative purposes only, the through-vias of the target inductor 502 and tuner inductors 504 are shown in FIG. 5 as circles. For a signal passing through one of the through-vias in the first direction 510, the through-via is shown as a dashed circular line. Alternatively, for a signal passing through one of the through-vias in the second direction 512, the through-via is shown as a solid circular line. This symbolism is used in FIGS. 6-9 as well.

As shown in the embodiment of FIG. 5, there are eight tuner inductors 504 that surround the one target inductor 502. Passing signals through the adjacent tuner inductors 504 in the same direction as the target inductor 502 increases the mutual inductance and passing signals through the adjacent tuner inductors 504 in the opposite direction decreases the mutual inductance. In FIG. 5, signals pass in the first direction 510 through four of the tuner inductors 504 and in the second direction 512 through the four other tuner inductors 504. In addition, a signal passes in the second direction 512 through the target inductor 502. The four tuner inductors 504 through which the signals pass in the second direction 512 increase the total inductance of the target inductor 502, whereas the four tuner inductors 504 through which the signals pass in the first direction 510 decrease the total inductance.

The total inductance of the target inductor 502 can be adjusted or programmed by switching the signal direction of one or more of the tuner inductors 504. As described above, each of the eight tuner inductors 504 are independently controlled, and therefore a range of inductance values can be achieved for the target inductor 502. For example, in FIG. 5, switching the signal direction through the first tuner via 504 (labeled #1) from the second direction 512 to the first direction 510 will reduce the total inductance of the target inductor 502 by a first amount (e.g., 0.6 nH). Likewise, switching the signal direction through the fifth tuner inductor 504 (labeled #5) will reduce the total inductance of the target inductor 502 by a second amount (e.g., 0.6 nH). The total inductance of the target inductor 502 therefore can be increased or decreased in steps depending on the number of tuner inductors 504 through which the signal direction is switched.

Although not shown in FIG. 5, it is also possible for signals not to pass through one or more of the tuner inductors. For instance, the total inductance of the target inductor 502 can be tuned by passing a signal through only one of the tuner inductors 504. In this example, no signal passes through the other seven tuner inductors. Passing signals through more or less of the tuner inductors 504 increases or decreases the amount of augmentation and the amount of cancellation of the mutual inductance with the target inductor 502.

Figure 6:
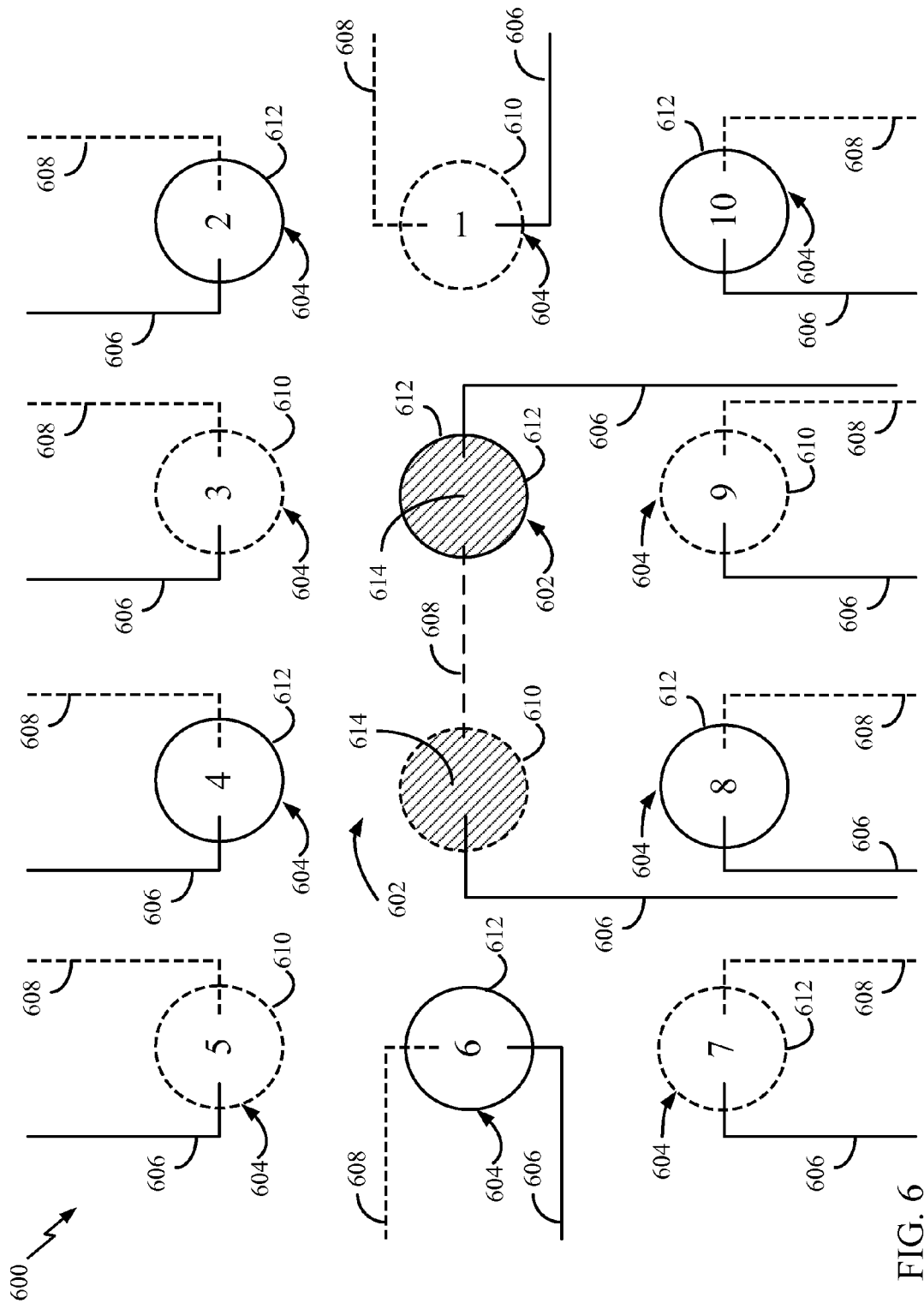
FIG. 6 is a schematic of a second exemplary programmable three-dimensional inductor in a high-resistance substrate.

With reference to the embodiment of FIG. 6, an electronic package 600 is provided that includes a target inductor 602 having two through vias 614. Each of the through-vias 614 of the target inductor 602 is coupled at each end of the substrate to a conductive trace. In particular, a frontside trace 606 and a backside trace 608 couple the two through-vias 614 of the target inductor 602 to form a continuous conductive path. A signal passes through one through-via 614 of the target inductor 602 in a first direction 610 and through the other through-via 614 in a second direction 612. Again, the first and second directions are opposite from one another and substantially orthogonal to the front and back surfaces of the substrate.

The package 600 also includes ten tuner inductors 604. The tuner inductors 604 form a rectangular array and surround the target inductor 602. Each of the tuner inductors 604 includes a through-via that is coupled to an independent frontside trace 606 and backside trace 608. As such, each tuner inductor 604 forms an independent conductive path that can be controlled independently from the other tuner inductors 604. Therefore, the total inductance of the target inductor 602 can be programmed or varied by switching the direction a signal passes through the through-via of one or more of the tuner inductors 604, and by controlling the number of tuner inductors 604 a signal passes through in each direction.

Figure 7:
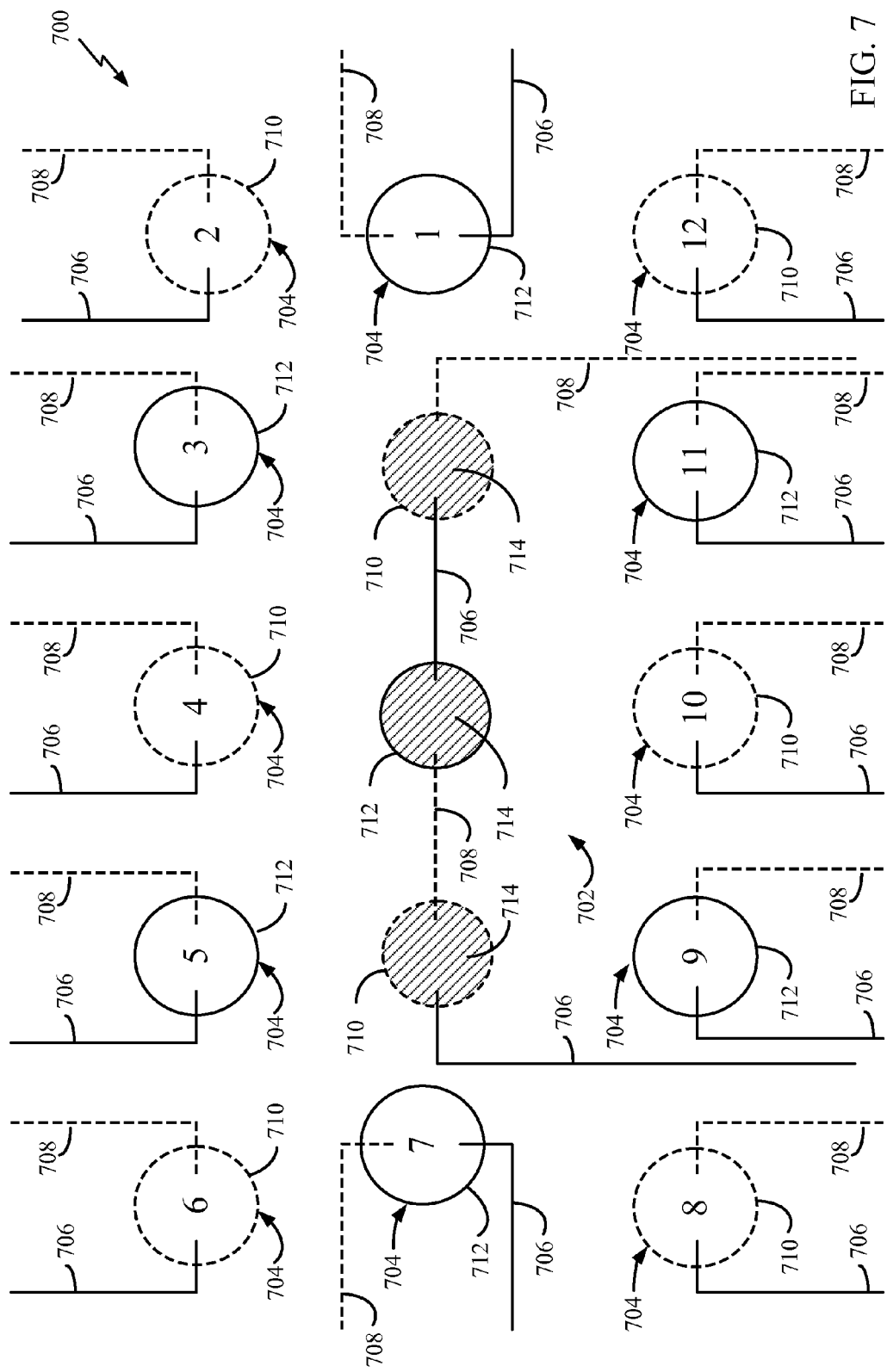
FIG. 7 is a schematic of a third exemplary programmable three-dimensional inductor in a high-resistance substrate.

A different embodiment of a three-dimensional programmable inductor is shown in FIG. 7. In this embodiment, an electronic package 700 comprises a high-resistance substrate that can be formed of glass, sapphire or other high-resistance material. The package 700 further includes a target inductor 702 and twelve tuner inductors 704. The target inductor 702 includes three through-vias 714 that are coupled to frontside traces 706 and backside traces 708 to form a single continuous conductive path. On the other hand, each tuner inductor 704 includes a through-via that is coupled at each end thereof to a conductive trace, but unlike the through-vias 714 of the target inductor 702, each tuner inductor 704 forms an independent conductive path. As such, a signal that passes through the through-via of each tuner inductor 704 can be independently controlled. The direction of the signal passing through each tuner inductor 704 and the number of tuner inductors 704 through which a signal passes can be independently adjusted to control the total inductance of the target inductor 702.

In the embodiment of FIG. 7, an independent signal passes through the second, fourth, sixth, eighth, tenth, and twelfth tuner inductors 704 (labeled 2, 4, 6, 8, 10, and 12, respectively) in a first direction 710 (direction is denoted by the dashed circular line representing the through-via of each tuner inductor 704). In the first, third, fifth, seventh, ninth, and eleventh tuner inductors 704 (labeled 1, 3, 5, 7, 9, and 11), an independent signal passes through in a second direction 712 (direction is denoted by the solid circular line representing the through-via of each tuner inductor 704). In other words, there are six tuner inductors 704 through which a signal passes in the first direction 710 and six tuner inductors 704 through which a signal passes in the second direction 712. As for the target inductor 702, a signal passes through two of the through-vias 714 in the first direction 710 and through one of the through-vias 714 in the second direction 712. Since signals pass through the same number of tuner inductors 704 in the first direction 710 as the second direction 712, the mutual inductance impact of each tuner inductor 704 on the target inductor 702 is negligible. However, to increase or decrease the total inductance of the target inductors 702, the signal direction in one or more of the tuner inductors 704 can be switched or no signal can pass through one or more of the tuner inductors 704.

Figure 8:
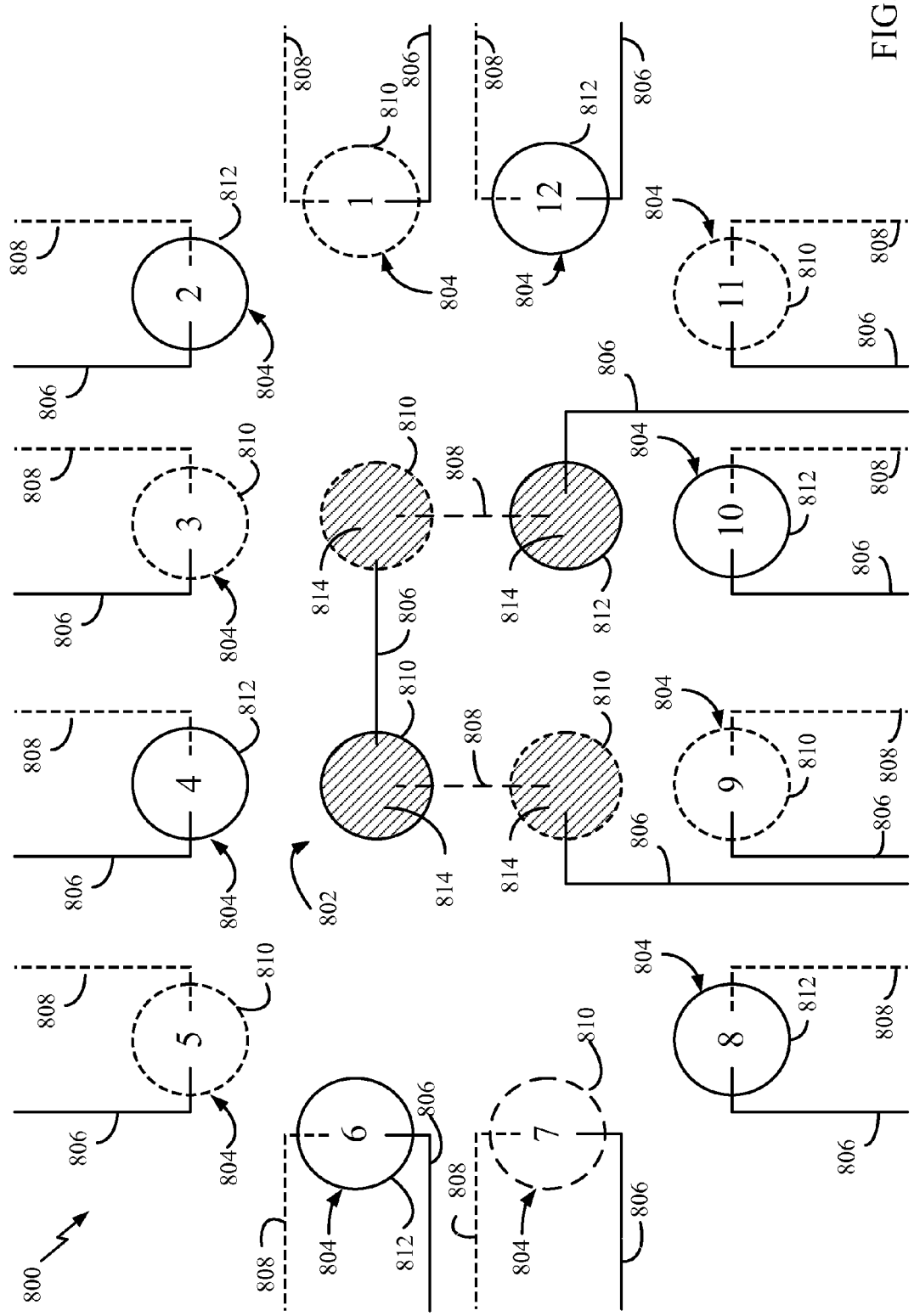
FIG. 8 is a schematic of a fourth exemplary programmable three-dimensional inductor in a high-resistance substrate.

Another embodiment of a three-dimensional inductor formed in an electronic package 800 is shown in FIG. 8. In FIG. 8, the electronic package 800 includes a target inductor 802 that includes four through-vias 814 arranged in a 2×2 array. Each through-via 814 is coupled by a frontside trace 806 and a backside trace 808. Similar to the target inductors described in the embodiments above, each of the through-vias 814 of the target inductor 802 is coupled to one another to form a single, continuous conductive path.

The package 800 also includes twelve tuner inductors 804 that are arranged in a rectangle surrounding the target inductor 802. Each of the tuner inductors 804 includes a through-via coupled to a frontside trace 806 and a backside trace 808. In addition, each of the tuner inductors 804 forms an independent conductive path through which a signal can pass in a direction that can be independently controlled. In this embodiment, a signal passes in a first direction 810 (direction is denoted by the dashed circular line representing the through-via) through six of the tuner inductors 804 and in a second direction 812 (direction is denoted by the solid circular line representing the through-via) through the other six tuner inductors 804. Likewise, a signal passes through two of the through-vias 814 of the target inductor 802 in the first direction 810 and through the other two through-vias 814 in the second direction 812. As described above, the first and second directions 810, 812 are parallel but opposite from one another.

The total inductance of the target inductor 802 can be controlled by switching the signal direction of the signal passing through the tuner inductors 804, and by switching the number of tuner inductors 804 through which signals pass in each direction. The signal direction in each tuner inductor 804 impacts the inductance value of the target inductor 802. For example, one end of the inductance range can be achieved by passing individual signals through each of the tuner inductors 804 in the first direction 810. The opposite end of the inductance range can be achieved by passing individual signals through each of the tuner inductors 804 in the second direction 812. Different steps between these extremes can be achieved by changing the number of tuner inductors through which a signal is passed and the direction of the signal.

Figure 9:
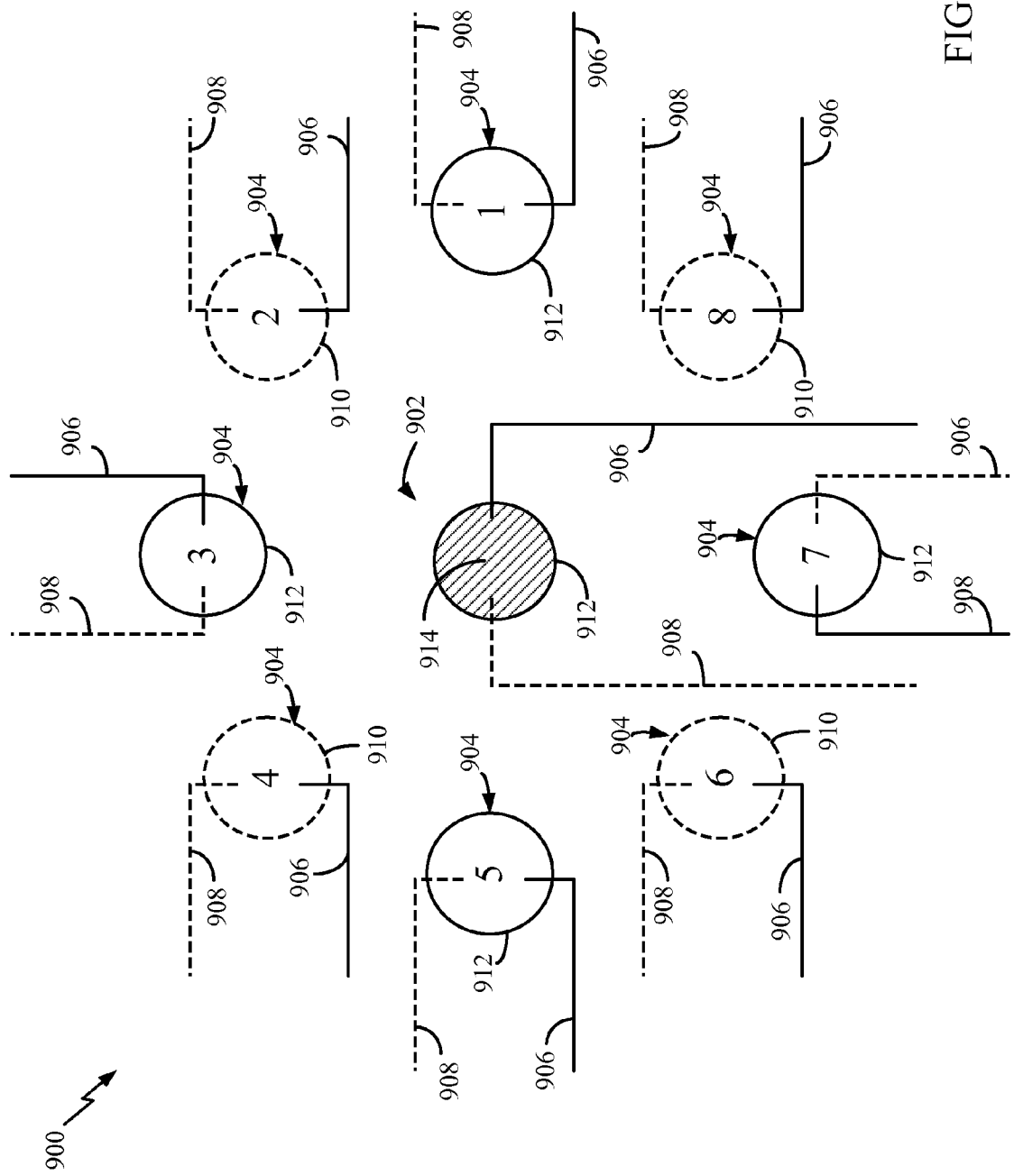
FIG. 9 is a schematic of a fifth exemplary programmable three-dimensional inductor in a high-resistance substrate.

A different embodiment of the three-dimensional, programmable inductor is shown in FIG. 9. An electronic package 900 includes a target inductor 902 and eight tuner inductors 904. The target inductor 902 includes a through-via formed in a high-resistance substrate. The through-via is coupled to a frontside trace 906 and a backside trace 908, thereby forming a single conductive path. The target inductor 902 can include a plurality of through-vias fabricated in the substrate.

The tuner inductors 904 are arranged in a circle surrounding the target inductor 902. Each of the tuner inductors 904 includes a through-via that is coupled to a frontside trace 906 and a backside trace 908. As such, each of the tuner inductors 904 forms an independent conductive path. By arranging the tuner inductors 904 in a circle, each tuner inductor 904 is approximately the same distance from the target inductor 902 and the amount of space in the substrate occupied by the target inductor 902 and tuner inductors 904 is less than in a non-circular arrangement.

Similar to the previously described embodiments, each tuner inductor 904 can be controlled independently from the other tuner inductors 904. In FIG. 9, individual signals pass through the second, fourth, sixth, and eighth tuner inductors 904 (labeled 2, 4, 6, and 8) in a first direction 910 and through the first, third, fifth, seventh, and ninth tuner inductors 904 (labeled 1, 3, 5, 7, and 9) in a second direction 912. The first direction 910 is parallel to but opposite the second direction 912, and both directions are substantially orthogonal to the front and back surfaces of the substrate. A signal passes through the target inductor 902 in the second direction 912. To change the total inductance of the target inductor 902, the signal passing through at least one of the tuner inductors 904 can be switched. For example, the signal passing through the first tuner inductor 904 can be switched from the second direction 912 to the first direction 910. Therefore, a desired inductance can be achieved by changing the direction of the signal passing through one or more of the tuner inductors 904. The inductance of the target inductor 902 can also be tuned by passing a signal through less than all eight of the tuner inductors 904.

The variable inductors described above with reference to FIGS. 5-9 include several advantages. In certain power applications, it can be desirable to adjust or control the amount of inductance in a circuit. For example, in a circuit that has a time-varying capacitive load or a varying frequency of operation, the circuit can be tuned by varying the inductance to minimize the required reactive current being supplied by a power source. The variable or programmable inductors described above can be advantageously incorporated in these circuits. In addition, a wide tunable LC-VCO using a variable or programmable inductor can be one of the key circuits for a reconfigurable RF circuit.

Another advantage is fabricating the variable or programmable inductor in a high-resistance substrate. A glass substrate, for example, has less losses than a silicon substrate (e.g., eddy current losses). Also, the resonant frequency is improved with the high-resistance substrate. In addition, the total inductance of a through-glass via array inductor, for example, can have more than twice the total inductance of a two-dimensional, spiral inductor that has similar layout dimensions.

Figure 10:
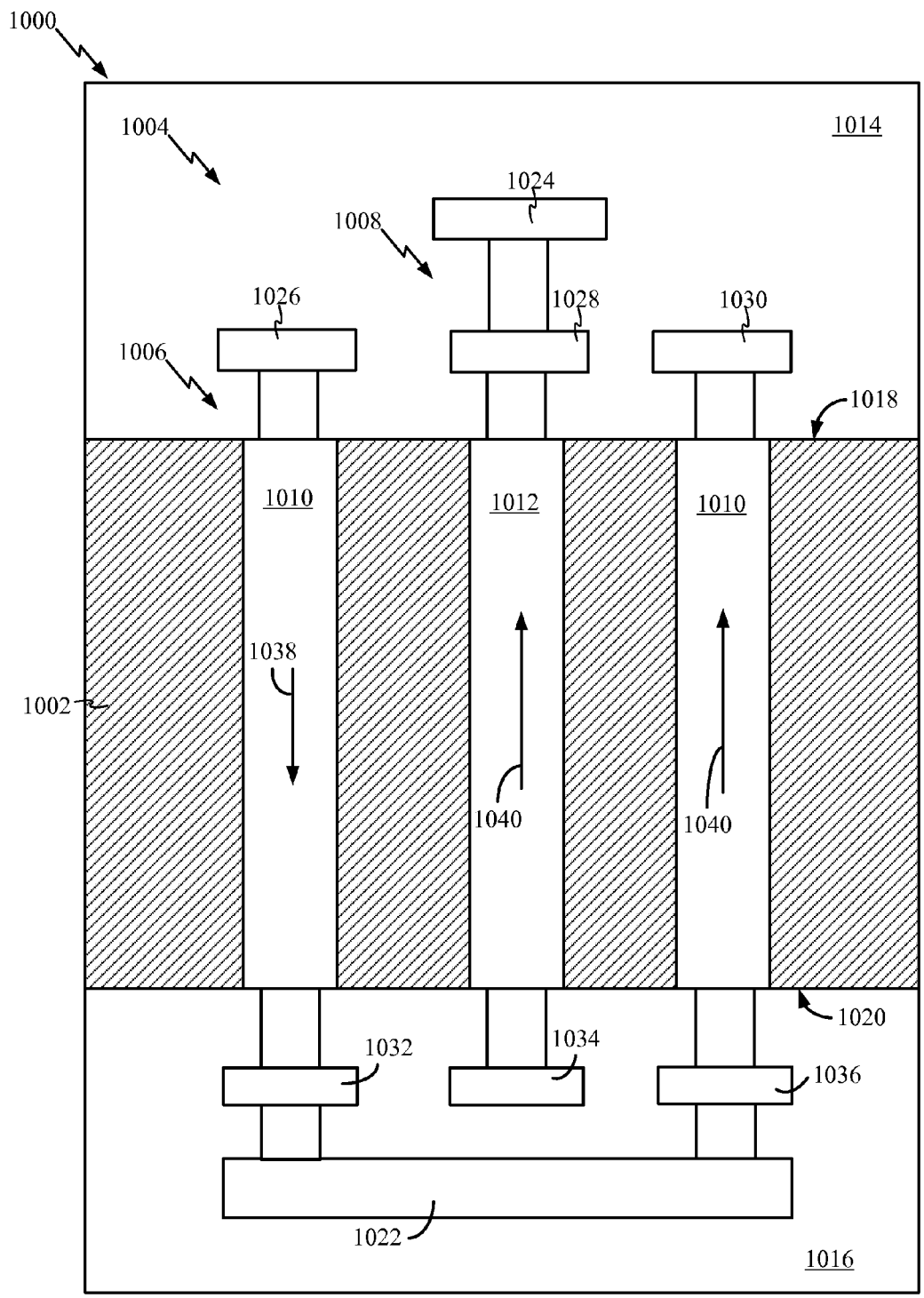
FIG. 10 is a cross-sectional view of an electronic package including a three-dimensional transformer.

Turning to FIG. 10, a different exemplary embodiment of a three-dimensional transformer 1004 is formed in an electronic package 1000. The electronic package 1000 includes a high-resistance substrate 1002 such as glass, sapphire, or other known high-resistance materials. The transformer 1004 includes a primary loop 1006 and a secondary loop 1008. The primary loop 1006 is formed by a plurality of through-vias 1010 that are coupled to one another by traces 1022 on the frontside and backside of the substrate 1002. Likewise, the secondary loop 1008 includes a plurality of through-vias 1012 that are also coupled to traces (although not shown in FIG. 10) on the frontside and backside of the substrate 1002.

The plurality of through-vias 1010 of the primary loop can couple to metal layers 1026, 1030 on the frontside of the substrate 1002 and metal layers 1032, 1036 on the backside of the substrate 1002. Similarly, the plurality of through-vias 1012 of the secondary loop 1008 can couple to metal layers 1024, 1028 on the frontside of the substrate 1002 and a metal layer 1034 on the backside of the substrate 1002. The metal layers can be surrounded by dielectric material 1014, 1016 on the frontside and backside of the substrate 1002, respectively.

The plurality of through-vias and conductive traces of the primary and secondary loops 1006, 1008 each form independent, continuous conductive paths. A signal that passes through the plurality of through-vias of the primary and secondary loops can do so in either a first direction 1038 or a second direction 1040. The first direction 1038 is parallel to the second direction 1040, but the two directions are opposite one another. In addition, the first and second directions are substantially orthogonal to the front surface 1018 and back surface 1020 of the substrate 1002.

The length of each through-via is greater than the length of the conductive traces. In a non-limiting example, the diameter and length of a through-glass via (TGV) 1010, 1012 can be between 5-50 μm and 50-700 μm, respectively. Since length affects mutual inductance, when the through-via is longer, the mutual inductance is greater. In addition, by increasing the thickness of the substrate 1002, the efficiency of the transformer 1004 improves as well. The efficiency improves because the coupling between the primary and secondary loops increases (i.e., there are additional couplings and less field leaks).

The primary loop and secondary loop also form a transformer ratio. The transformer ratio can be defined as the ratio of the quantity of through-vias 1010 in the primary loop 1006 to the quantity of through-vias 1012 in the secondary loop 1008. For instance, in the embodiment of FIG. 10, the primary loop 1006 has two through-vias 1010 and the secondary loop 1008 has one through-via 1012. Thus, the transformer ratio is 2:1. The transformer ratio can be adjusted by increasing or decreasing the quantity of through-vias in the primary and secondary loops.

The transformer ratio can impact the output voltage and impedance of the transformer 1004. Circuit performance in RF applications, for example, can depend on impedance isolation. The embodiment of FIG. 10 provides a means for achieving impedance matching because the transformer ratio can be adjusted by changing the number of through-vias in either the primary loop 1006 or secondary loop 1008. In one embodiment, a transformer ratio greater than 1:1 can reduce the output voltage, whereas a transformer ratio less than 1:1 can increase the output voltage.

Figure 11:
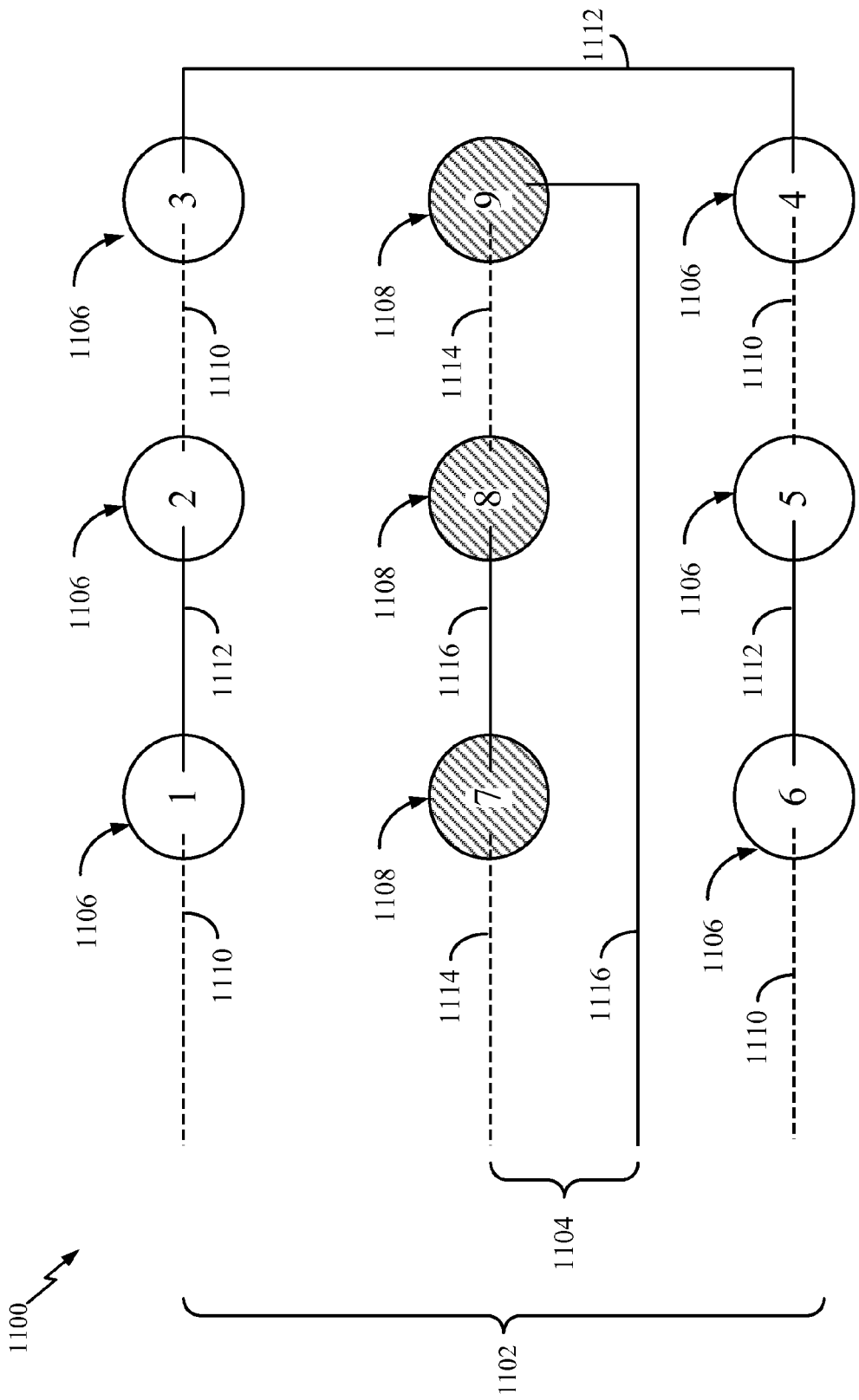
FIG. 11 is a schematic of a first exemplary programmable three-dimensional transformer in a high-resistance substrate.

The embodiments shown in FIGS. 11-16 are provided as non-limiting examples of the three-dimensional transformer described above. With reference to FIG. 11, a transformer 1100 is formed in an electronic package. The transformer 1100 includes a primary loop 1102 and a secondary loop 1104. The primary loop 1102 includes six through-vias 1106 that are formed in a high-resistance substrate such as glass or sapphire. The through-vias are coupled to one another by frontside traces 1112 and backside traces 1110 to form a continuous conductive path. Likewise, the secondary loop 1104 includes three through-vias 1108. Each through-via 1108 is coupled at each end thereof to a frontside trace 1116 and a backside trace 1114. The three through-vias 1108 are coupled to one another to form a continuous conductive path.

In the embodiment of FIG. 11, there are six through-vias 1106 in the primary loop 1102 and three through-vias 1108 in the secondary loop 1104. Thus, the transformer ratio is 6:3, or 2:1. As a signal passes through the primary loop 1102, an induced signal is generated in the secondary loop 1104 (e.g., a transfer of energy from the primary loop to the secondary loop). The induced signal is dependent on the transformer ratio. If the transformer ratio is increased, for example, the output voltage in the secondary loop decreases. On the other hand, if the transformer ratio is decreased, the output voltage in the secondary loop increases. The design and layout of the transformer can be arranged such that during fabrication the transformer ratio is established. Therefore, if an output voltage or impedance is desired, the transformer ratio for achieving the desirable result can be set during fabrication by forming the desired quantity of through-vias in the primary and/or secondary loops.

Figure 12:
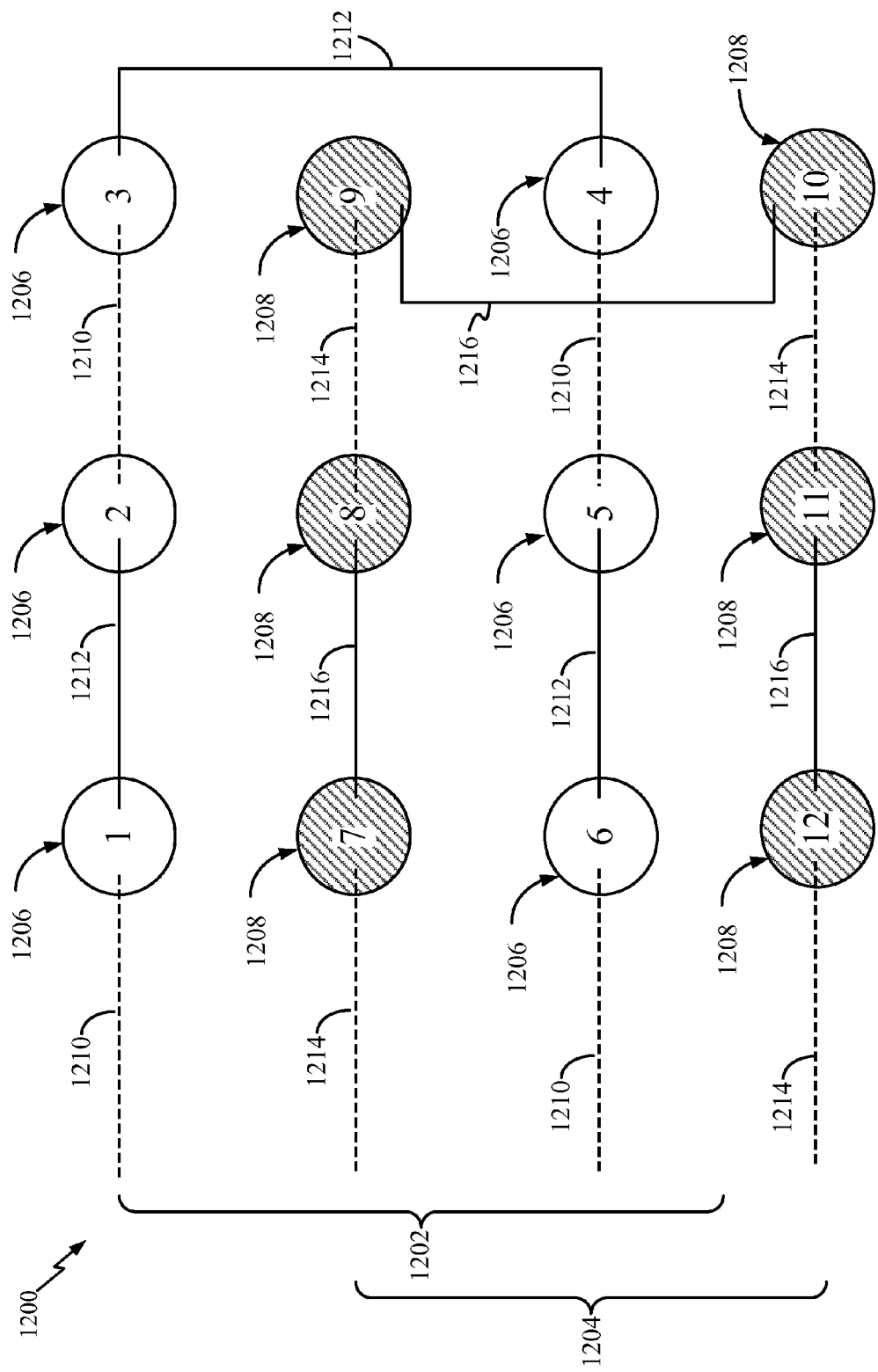
FIG. 12 is a schematic of a second exemplary programmable three-dimensional transformer in a high-resistance substrate.

In FIG. 12, another embodiment of a transformer 1200 is provided. The transformer 1200 includes a primary loop 1202 and secondary loop 1204. The primary loop 1202 comprises six through-vias 1206 that are coupled to one another by frontside traces 1212 and backside traces 1210. Likewise, the secondary loop 1204 includes six through-vias 1208 that are also coupled to one another by frontside traces 1216 and backside traces 1214. The through-vias 1206, 1208 are advantageously fabricated in a high-resistance substrate such as glass, sapphire, or other high-resistance material.

In this embodiment, the transformer ratio is 6:6, or 1:1. The transformer 1200 can provide impedance matching or isolation to provide better circuit performance. In an RF circuit, for example, impedance matching is important for physically isolating two different circuits. Although there is physical isolation, the transformer 1200 through electromagnetic coupling can transfer or pass a signal between the primary loop 1202 and secondary loop 1204.

Figure 13:
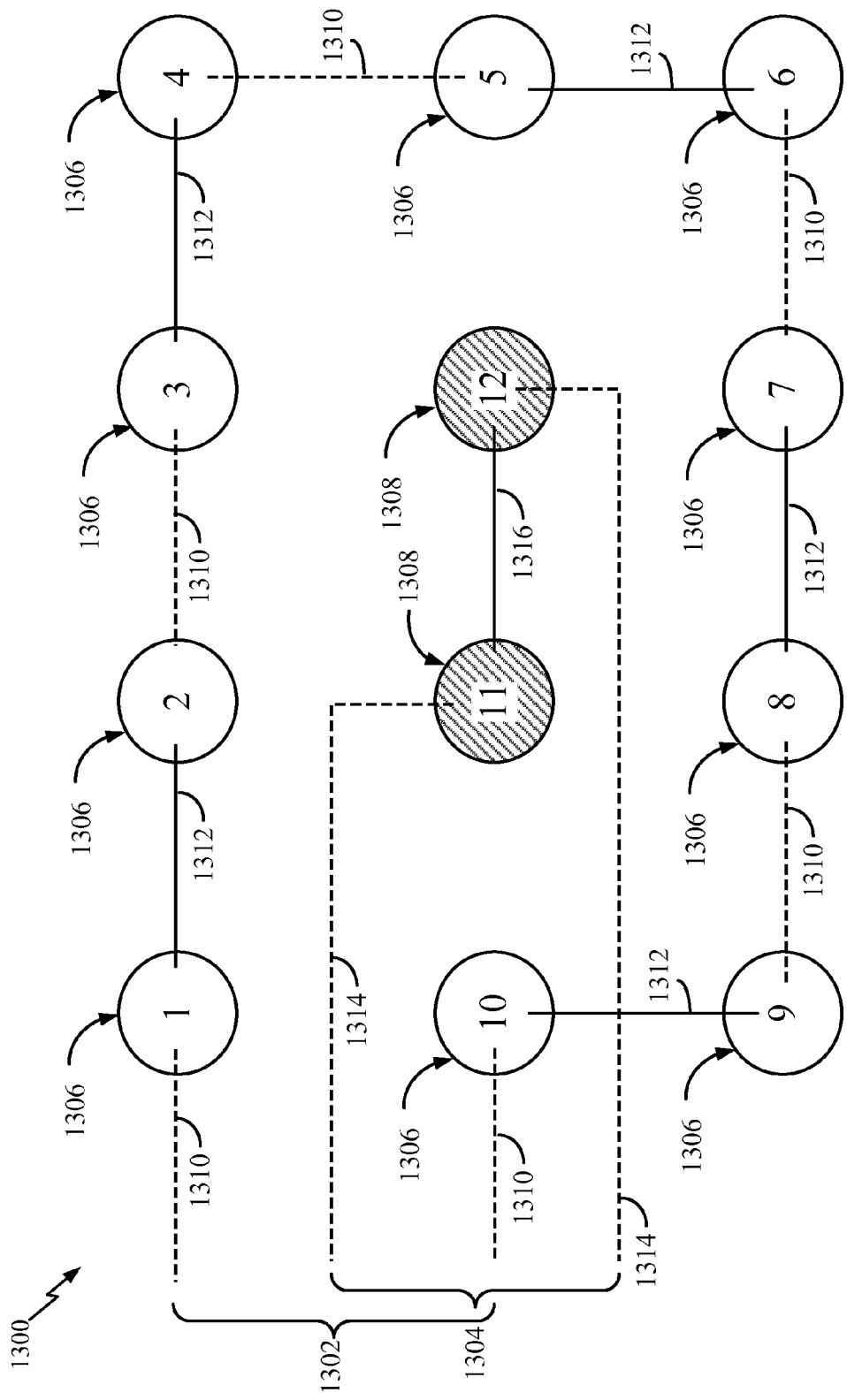
FIG. 13 is a schematic of a third exemplary programmable three-dimensional transformer in a high-resistance substrate.

With reference to FIG. 13, a different embodiment of a three-dimensional transformer 1300 formed in a high-resistance substrate is illustrated. The transformer 1300 comprises a primary loop 1302 and a secondary loop 1304. The primary loop 1302 includes ten through-vias 1306 formed in the substrate. The through-vias 1306 are coupled to one another on the frontside of the substrate by a plurality of frontside traces 1312 and on the backside of the substrate by a plurality of backside traces 1310 to form a continuous conductive path. The secondary loop 1304 includes two through-vias 1308 that are fabricated in the high-resistance substrate. The two through-vias 1308 are coupled to one another by a frontside trace 1316 to form a continuous conductive path. On the backside of the substrate, the through-vias 1308 are coupled to backside traces 1314.

The transformer ratio in this embodiment is 10:2, or 5:1. As a signal passes through the primary loop 1302, another signal is induced in the secondary loop 1304. The output voltage, for example, in the secondary loop 1304 is reduced by 5× due to the transformer ratio. The transformer ratio can be established before fabrication by adjusting the quantity of primary and secondary through-vias. Since output voltage and impedance is dependent on the number of turns in the two loops, adding or removing one or more through-vias from one or both of the loops will change the number of turns in each loop. Accordingly, a desired output voltage or impedance can be achieved.

Figure 14:
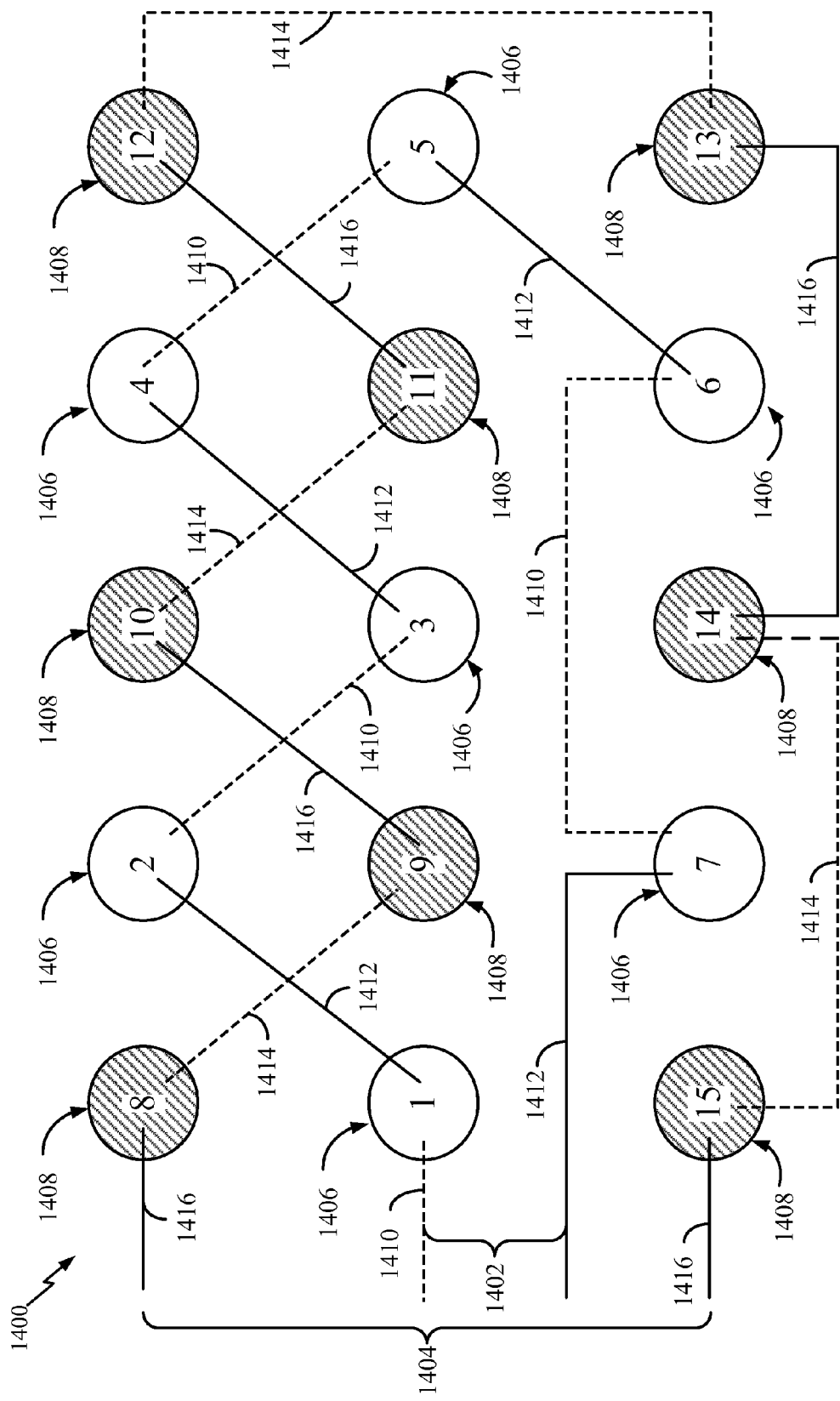
FIG. 14 is a schematic of a fourth exemplary programmable three-dimensional transformer in a high-resistance substrate.

In the embodiment of FIG. 14, a three-dimensional transformer 1400 formed in a high-resistance substrate is shown. The transformer 1400 includes a primary loop 1402 and a secondary loop 1404. The primary loop 1402 includes seven through-vias 1406 that are coupled to one another by a plurality of frontside traces 1412 and a plurality of backside traces 1410. The primary loop 1402 comprises a continuous conductive path or circuit through which a signal can pass. The secondary loop 1404 comprises eight through-vias 1408 that are coupled to one another by a plurality of frontside traces 1416 and a plurality of backside traces 1414. The secondary loop 1404 forms an independent continuous conductive path through which a signal can pass.

The conductive traces of both the primary loop 1402 and secondary loop 1404 can criss-cross on different sides of the substrate as shown in FIG. 14. It can also be advantageous for the length of each conductive trace to be reduced, if possible, as there can be a small mutual inductance impact when through-vias are spaced further from one another. For example, the twelfth and thirteenth through-vias 1408 (labeled #12 and 13) of the secondary loop 1404 are spaced further apart from one another than the eleventh and twelfth through-vias 1408. The mutual inductance impact can affect the efficiency of the transformer 1400.

The transformer ratio in FIG. 14 is 7:8. As a signal passes through the primary loop 1402, another signal is induced in the secondary loop 1404. The output voltage, for example, in the secondary loop 1404 is increased due to the transformer ratio. Prior to fabrication, the transformer ratio can be set by forming the desired number of through-vias in the primary loop 1402 and/or secondary loop 1404. For example, adding an additional through-via in the secondary loop 1404 would change the transformer ratio to 7:9 and thereby further increase the induced signal. Accordingly, a desired output voltage or impedance can be achieved by determining the transformer ratio for achieving the output voltage or impedance and fabricating the requisite number of through-vias in the primary and secondary loops.

Figure 15:
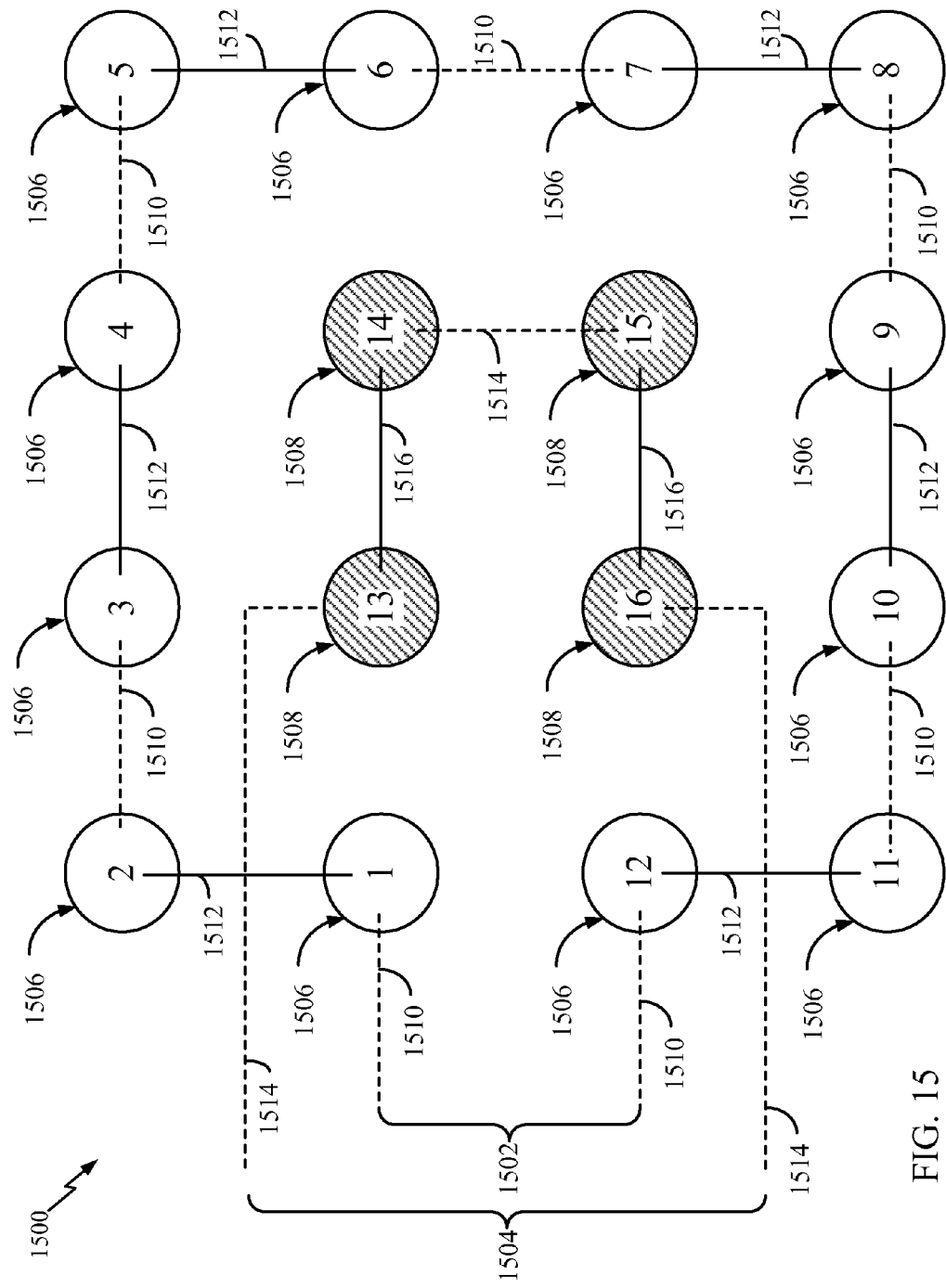
FIG. 15 is a schematic of a fifth exemplary programmable three-dimensional transformer in a high-resistance substrate.

With reference to FIG. 15, another embodiment of a three-dimensional transformer 1500 is illustrated. The transformer 1500 is formed in a high-resistance substrate such as glass or sapphire, for example, and includes a primary loop 1502 and a secondary loop 1504. Both the primary loop 1502 and secondary loop 1504 are independent, continuous circuits or conductive paths formed of through-vias and conductive traces. The primary loop 1502, for example, includes twelve through-vias 1506 that are coupled to one another by a plurality of frontside traces 1512 and backside traces 1510. The secondary loop 1504 comprises four through-vias 1508 that are coupled to one another by a plurality of frontside traces 1516 and backside traces 1514. Although the through-vias and conductive traces could be arranged in a plurality of different manners, in FIG. 15, the primary loop 1502 surrounds the secondary loop 1504.

Of greater importance, however, is that the transformer ratio is 12:4, or 3:1. As a signal passes through the primary loop 1502, a signal is induced in the secondary loop 1504. Due to the transformer ratio, the induced signal is reduced by 3× compared to the signal passing through the primary loop 1502. The induced signal can be increased or further reduced by changing the transformer ratio. For example, the induced signal can be decreased by increasing the transformer ratio (e.g., add one or more through-vias to the primary loop 1502 or remove one or more through-vias from the secondary loop 1504 during fabrication). Alternatively, as another example, the induced signal can be increased by decreasing the transformer ratio (e.g., add one or more through-vias to the secondary loop 1504 or remove one or more through-vias from the primary loop 1502 during fabrication).

Figure 16:
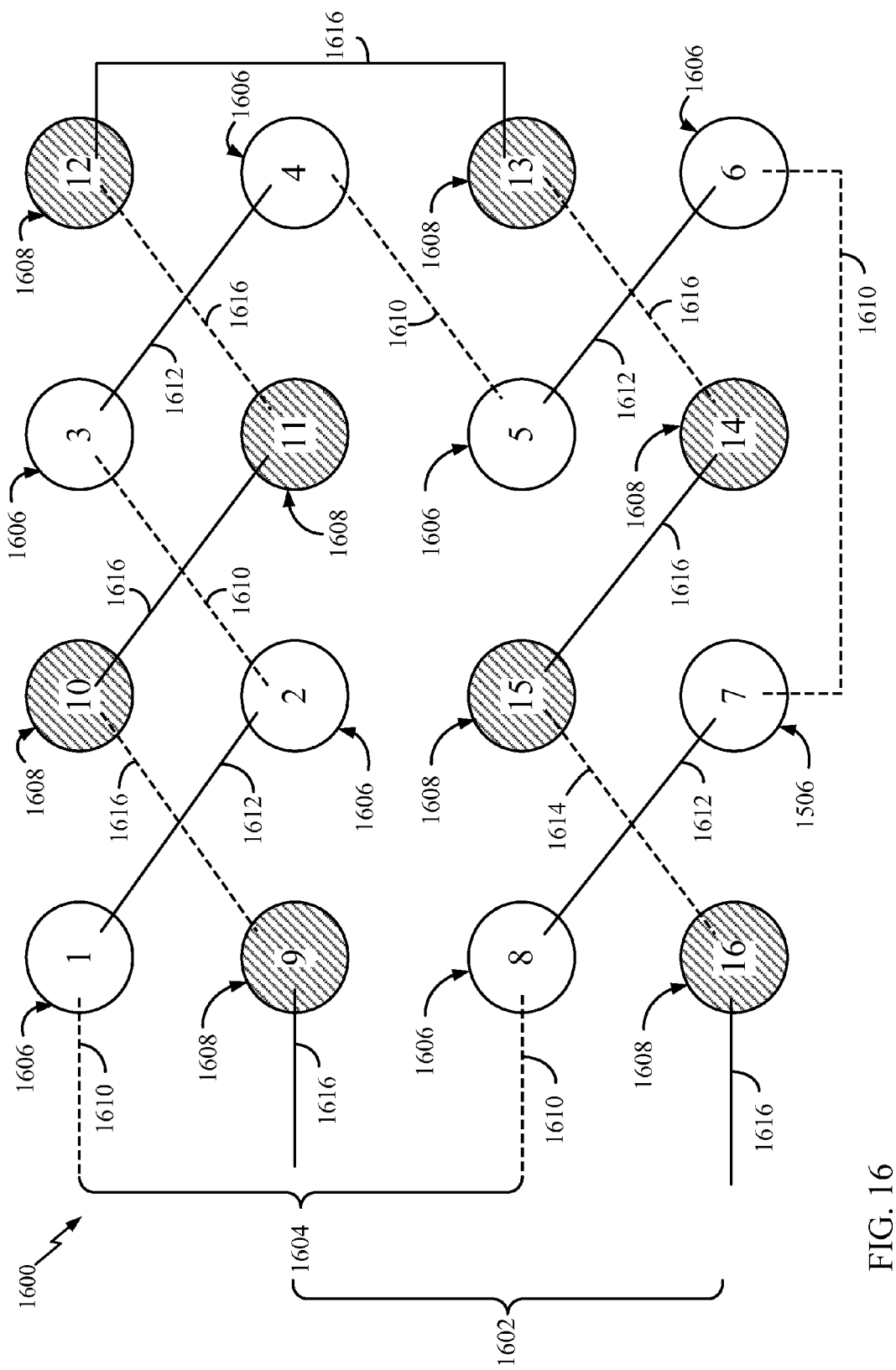
FIG. 16 is a schematic of a sixth exemplary programmable three-dimensional transformer in a high-resistance substrate.

A different embodiment of a three-dimensional transformer 1600 formed in a high-resistance substrate is illustrated in FIG. 16. The transformer 1600 includes a primary loop 1602 and a secondary loop 1604. The primary loop 1602 comprises eight through-vias 1606. The eight through-vias 1606 are coupled to one another by a plurality of frontside traces 1612 and a plurality of backside traces 1610 to form a continuous conductive path or circuit. Likewise, the secondary loop 1604 comprises eight through-vias 1608. The eight through-vias 1608 of the secondary loop 1604 are also coupled to a plurality of frontside traces 1616 and a plurality of backside traces 1614 to form an independent conductive path or circuit. The transformer ratio of this embodiment is 8:8, or 1:1.

Although specific examples were shown in FIGS. 11-16, a three-dimensional transformer can be designed to achieve any desired transformer ration to affect output and/or circuit performance. Through-vias can be spaced from one another based on desired circuit performance and the available space in the substrate. As described above, the transformer can be used to transform voltage and impedance matching. It can also be used as a differential input or output, particularly in RF applications.

The three-dimensional transformer is advantageous over a two-dimensional transformer because the former requires less area in the substrate and has a higher efficiency. In particular, the vertical array of through-vias allows the circuits or loops of the transformer to be spaced in closer proximity to one another. A through-glass via, for example, can be easily fabricated in the glass substrate without requiring an insulation layer. In addition, the three-dimensional transformer can be designed to meet any desirable impedance matching or output voltage requirement. Also, in a high-resistance substrate, there are fewer losses and a higher resonant frequency than in a silicon substrate.

Figure 17:
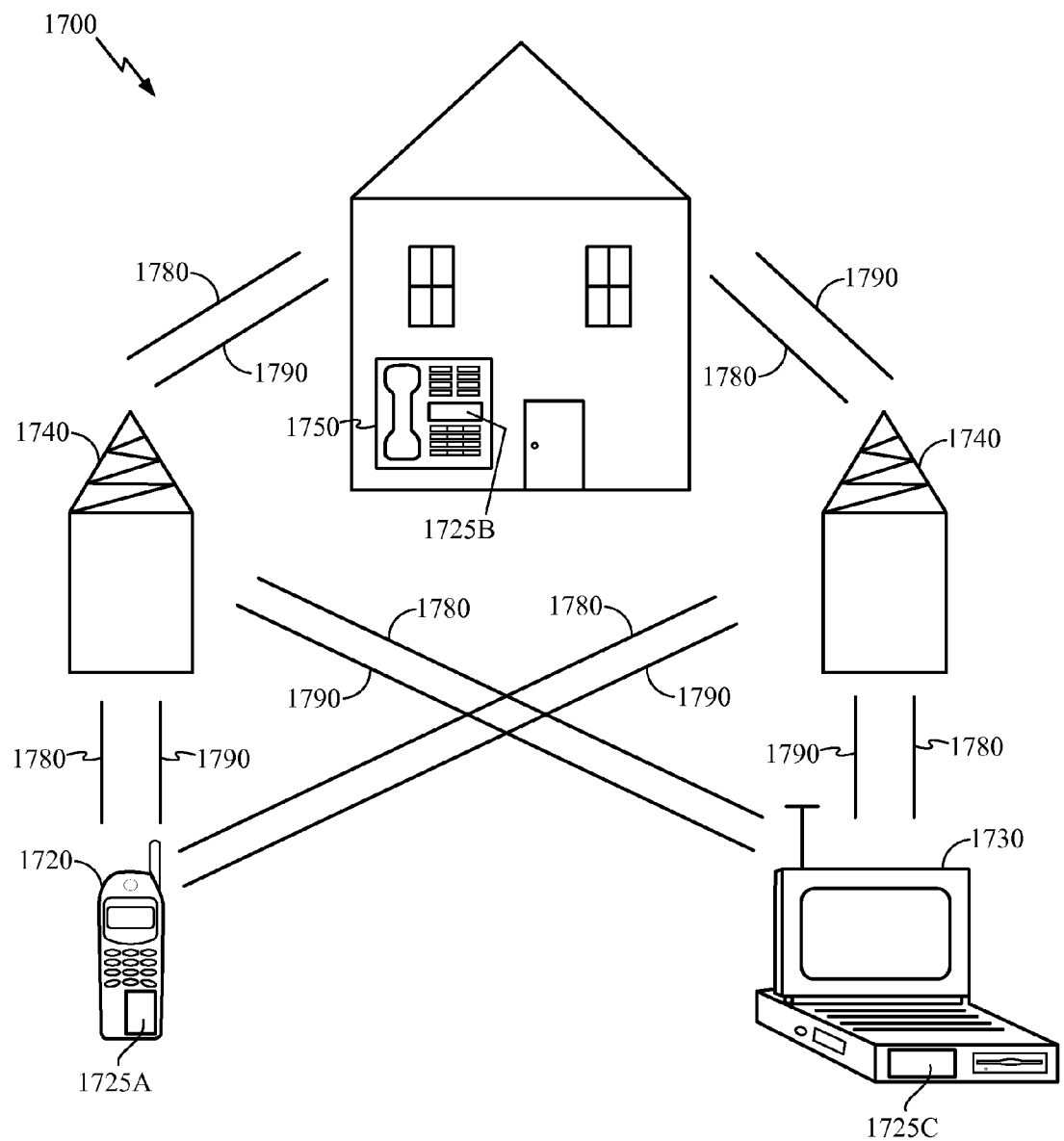
FIG. 17 is a block diagram showing an exemplary wireless communication system in which a three-dimensional inductor or transformer can be fabricated in a high-resistance substrate.

FIG. 17 shows an exemplary wireless communication system 1700 in which an embodiment of an electronic package having a three-dimensional inductor or transformer formed in a high-resistance substrate may be advantageously employed. For purposes of illustration, FIG. 17 shows three remote units 1720, 1730, and 1750 and two base stations 1740. It should be recognized that typical wireless communication systems may have many more remote units and base stations. Any of remote units 1720, 1730, and 1750 may include an electronic package having a three-dimensional inductor or transformer formed in a high-resistance substrate such as disclosed herein. FIG. 17 shows forward link signals 1780 from the base stations 1740 and the remote units 1720, 1730, and 1750 and reverse link signals 1790 from the remote units 1720, 1730, and 1750 to base stations 1740.

In FIG. 17, remote unit 1720 is shown as a mobile telephone, remote unit 1730 is shown as a portable computer, and remote unit 1750 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 17 illustrates certain exemplary remote units that may include an electronic package having a three-dimensional inductor or transformer formed in a high-resistance substrate as disclosed herein, the package substrate is not limited to these exemplary illustrated units. Embodiments may be suitably employed in any electronic device in which an electronic package having a three-dimensional inductor or transformer formed in a high-resistance substrate is desired.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A circuit in an electronic package, comprising:
   a high-resistance substrate having a top surface and a bottom surface;
   a first inductor including a first through-via formed in the substrate through which a first signal passes; and
   a second inductor including a second through-via formed in the substrate through which a second signal passes, the second signal passing in a first direction or a second direction, wherein the second direction is substantially parallel but opposite the first direction;
   further wherein, the total inductance of the first inductor is controlled by changing the direction of the second signal.

2. The circuit of claim 1, wherein the first inductor is a target inductor.

3. The circuit of claim 1, wherein the second inductor is a tuner inductor.

4. The circuit of claim 1, wherein the second inductor comprises a plurality of second inductors.

5. The circuit of claim 4, wherein the direction of the second signal passing through each of the plurality of second inductors is independently controlled.

6. The circuit of claim 4, wherein the total inductance of the first inductor is increased by passing the second signal through at least one of the plurality of second inductors in the same direction as the first signal.

7. The circuit of claim 4, wherein the total inductance of the first inductor is decreased by passing the second signal through at least one of the plurality of second inductors in the opposite direction as the first signal.

8. The circuit of claim 4, wherein the total inductance of the first inductor comprises a range of inductance values, the range being determined by the number of second inductors.

9. The circuit of claim 4, wherein when the second signal passes through each of the plurality of second inductors in the same direction as the first signal passes through the first inductor, the total inductance of the first inductor is at a maximum inductance value.

10. The circuit of claim 4, wherein when the second signal passes through each of the plurality of second inductors in the opposite direction as the first signal passes through the first inductor, the total inductance of the first inductor is at a minimum inductance value.

11. The circuit of claim 4, wherein the through-via of each of the plurality of second inductors is coupled to a conductive trace at the top and bottom surfaces of the substrate, thereby forming an independently continuous conductive path.

12. The circuit of claim 4, wherein the plurality of second inductors form an array of second inductors that substantially surround the first inductor.

13. The circuit of claim 12, wherein the array of second inductors form a circular or polygonal array.

14. The circuit of claim 1, wherein the first inductor comprises a plurality of through-vias.

15. The circuit of claim 14, wherein the plurality of through-vias of the first inductor are coupled to a plurality of conductive traces to form a continuous conductive path.

16. The circuit of claim 1, wherein the first signal and second signal pass through the through-vias of the first inductor and second inductor orthogonally to the top and bottom surfaces of the substrate.

17. The circuit of claim 1 incorporated into a device selected from a group consisting of a music player, a video player, an entertainment unit, a navigation device, a communications device, a personal digital assistant (PDA), a fixed location data unit, and a computer.

18. An integrated circuit in an electronic package, comprising:
   a high-resistance substrate;
   a means for storing energy in a magnetic field; and
   a means for tuning the means for storing;
   wherein, an independent signal passes through the means for tuning in a first direction or a second direction, the first direction being parallel but opposite the second direction;
   further wherein, the direction of the signal passing through the means for tuning is independently controlled such that the total inductance of the means for storing can be varied by changing the direction of the signal.

19. The integrated circuit of claim 18, wherein the means for storing includes at least one through-via.

20. The integrated circuit of claim 18, wherein the means for tuning includes at least one through-via.

21. The integrated circuit of claim 18, further comprising a plurality of means for tuning, each of the plurality of means for tuning forming an independent conductive path.

22. The integrated circuit of claim 18, further comprising a plurality of means for storing, the plurality of means for storing coupled together to form a continuous conductive path.

23. The integrated circuit of claim 18, wherein the total inductance of the means for storing is increased by passing the signal through the means for tuning in the same direction as a signal that passes through the means for storing.

24. The integrated circuit of claim 18, wherein the total inductance of the means for storing is decreased by passing the signal through the means for tuning in the opposite direction as a signal that passes through the means for storing.

25. The integrated circuit of claim 18 incorporated into a device selected from a group consisting of a music player, a video player, an entertainment unit, a navigation device, a communications device, a personal digital assistant (PDA), a fixed location data unit, and a computer.

26. A method of tuning a target inductor in a high resistance substrate, comprising:
   passing a signal through a through-via of a tuner inductor disposed in the substrate in a first direction or a second direction, the second direction being parallel but opposite the first direction; and
   controlling the direction of the signal such that the total inductance of the target inductor can be varied by changing the direction of the signal passing through the through-via of the tuner inductor.

27. The method of claim 26, further comprising forming a plurality of tuner inductors.

28. The method of claim 27, further comprising passing a signal through a through-via of the target inductor.

29. The method of claim 28, further comprising increasing the total inductance of the target inductor by passing the signal through at least one of the plurality of tuner inductors in the same direction as the signal passes through the target inductor.

30. The method of claim 28, further comprising decreasing the total inductance of the target inductor by passing the signal through at least one of the plurality of tuner inductors in the opposite direction as the signal passes through the target inductor.

31. The method of claim 26 incorporated into a device selected from a group consisting of a music player, a video player, an entertainment unit, a navigation device, a communications device, a personal digital assistant (PDA), a fixed location data unit, and a computer.

* * * * *